(12) United States Patent
Jang et al.

(10) Patent No.: US 9,299,631 B2
(45) Date of Patent: Mar. 29, 2016

(54) STACK-TYPE SEMICONDUCTOR PACKAGE

(71) Applicants: Ae-Nee Jang, Seoul (KR);
 Young-Lyong Kim, Daejeon (KR)

(72) Inventors: Ae-Nee Jang, Seoul (KR);
 Young-Lyong Kim, Daejeon (KR)

(73) Assignee: Samsung Electronics Co., Ltd.,
 Gyeonggi-do (KR)

( * ) Notice: Subject to any disclaimer, the term of this patent is extended or adjusted under 35 U.S.C. 154(b) by 54 days.

(21) Appl. No.: 14/286,483

(22) Filed: May 23, 2014

(65) Prior Publication Data

US 2015/0091149 A1 Apr. 2, 2015

(30) Foreign Application Priority Data

Sep. 27, 2013 (KR) .................. 10-2013-0115475

(51) Int. Cl.
 *H01L 25/11* (2006.01)
 *H01L 23/31* (2006.01)
 (Continued)

(52) U.S. Cl.
 CPC ...... *H01L 23/3128* (2013.01); *H01L 23/49811* (2013.01); *H01L 23/552* (2013.01); *H01L 25/105* (2013.01); *H01L 25/50* (2013.01); *H01L 24/13* (2013.01); *H01L 24/16* (2013.01); *H01L 24/32* (2013.01); *H01L 24/45* (2013.01); *H01L 24/48* (2013.01); *H01L 24/73* (2013.01); *H01L 25/0657* (2013.01); *H01L 2224/131* (2013.01); *H01L 2224/13124* (2013.01); *H01L 2224/13139* (2013.01); *H01L 2224/13144* (2013.01); *H01L 2224/13147* (2013.01); *H01L 2224/13169* (2013.01); *H01L 2224/16225* (2013.01); *H01L 2224/17181* (2013.01); *H01L 2224/17517* (2013.01); *H01L 2224/32145* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01);
 (Continued)

(58) Field of Classification Search
 CPC .................. H01L 25/117; H01L 2225/06548
 See application file for complete search history.

(56) References Cited

U.S. PATENT DOCUMENTS 5,475,569 A 12/1995 Jain et al.
7,208,825 B2 * 4/2007 Pu ..................... H01L 23/3128
 257/673

(Continued)

FOREIGN PATENT DOCUMENTS

KR 20080077837 A 8/2008
KR 100886100 B1 2/2009

*Primary Examiner* — Peniel M Gumedzoe
(74) *Attorney, Agent, or Firm* — Harness, Dickey & Pierce, P.L.C.

(57) ABSTRACT

According to example embodiments, a stack-type semiconductor package includes a lower semiconductor package, an upper semiconductor package, connection pads, and a metal layer pattern. The lower semiconductor package includes a lower semiconductor chip on a top surface of a lower package substrate, lower lands on the lower package substrate, and an encapsulant on the top surface of the lower package substrate. The encapsulant defines via holes that expose the lower lands. The upper semiconductor package is on the encapsulant. Upper solder balls are connected to a bottom surface of the upper semiconductor package. The connection pads are on the via holes and the encapsulant. The connection pads electrically connect the lower semiconductor package to the upper semiconductor package. The metal layer pattern is between the lower package substrate and the upper semiconductor package. The metal layer pattern surrounds the connection pads and is isolated from the connection pads.

20 Claims, 39 Drawing Sheets

(51) Int. Cl.
  *H01L 23/498* (2006.01)
  *H01L 23/552* (2006.01)
  *H01L 25/10* (2006.01)
  *H01L 25/00* (2006.01)
  *H01L 23/00* (2006.01)
  *H01L 25/065* (2006.01)

(52) U.S. Cl.
  CPC .......... *H01L2224/45157* (2013.01); *H01L 2224/45166* (2013.01); *H01L 2224/45169* (2013.01); *H01L 2224/45171* (2013.01); *H01L 2224/48091* (2013.01); *H01L 2224/48227* (2013.01); *H01L 2224/73265* (2013.01); *H01L 2225/0651* (2013.01); *H01L 2225/06568* (2013.01); *H01L 2225/1023* (2013.01); *H01L 2225/1041* (2013.01); *H01L 2225/1058* (2013.01); *H01L 2225/1076* (2013.01); *H01L 2225/1094* (2013.01); *H01L 2924/12042* (2013.01); *H01L 2924/15311* (2013.01); *H01L 2924/15331* (2013.01); *H01L 2924/1815* (2013.01); *H01L 2924/18161* (2013.01)

(56) References Cited

U.S. PATENT DOCUMENTS

| | | |
|---|---|---|
| 7,960,827 B1 * | 6/2011 | Miller, Jr. .......... H01L 23/3677 257/712 |
| 8,299,595 B2 | 10/2012 | Yoon et al. |
| 2006/0189124 A1 * | 8/2006 | Beer ................... H01L 25/105 438/622 |
| 2010/0072599 A1 * | 3/2010 | Camacho ........... H01L 21/6835 257/686 |
| 2010/0072600 A1 | 3/2010 | Gerber |
| 2010/0244216 A1 * | 9/2010 | Huang ................ H01L 21/561 257/686 |
| 2011/0024904 A1 * | 2/2011 | Egawa ................ H01L 21/568 257/738 |

* cited by examiner

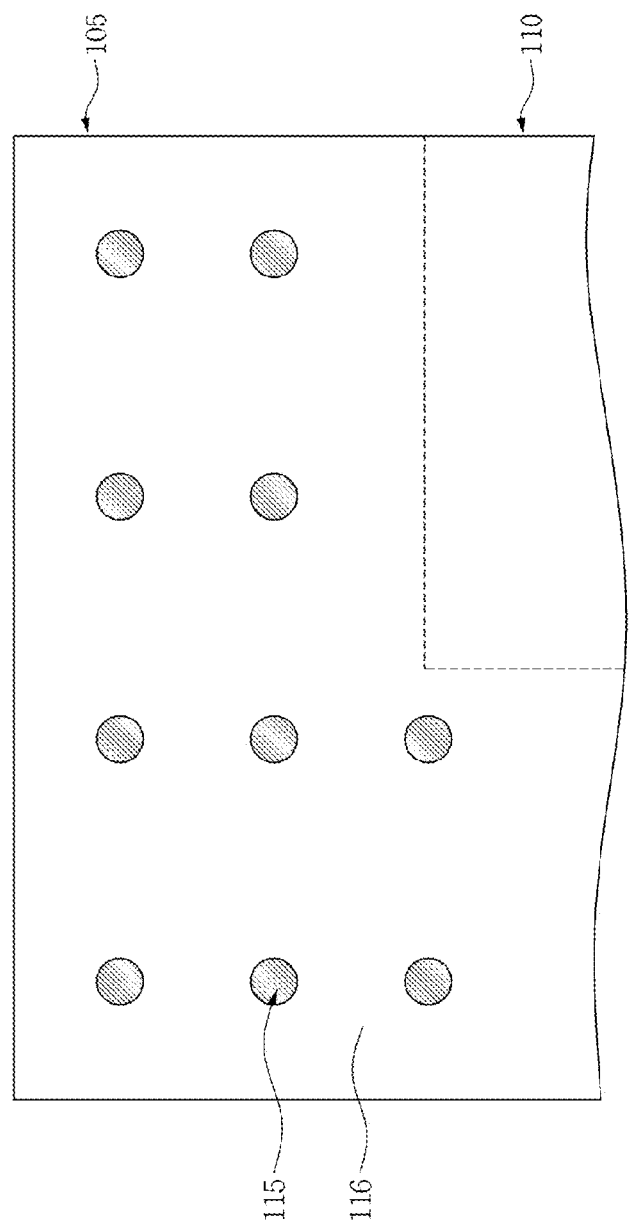

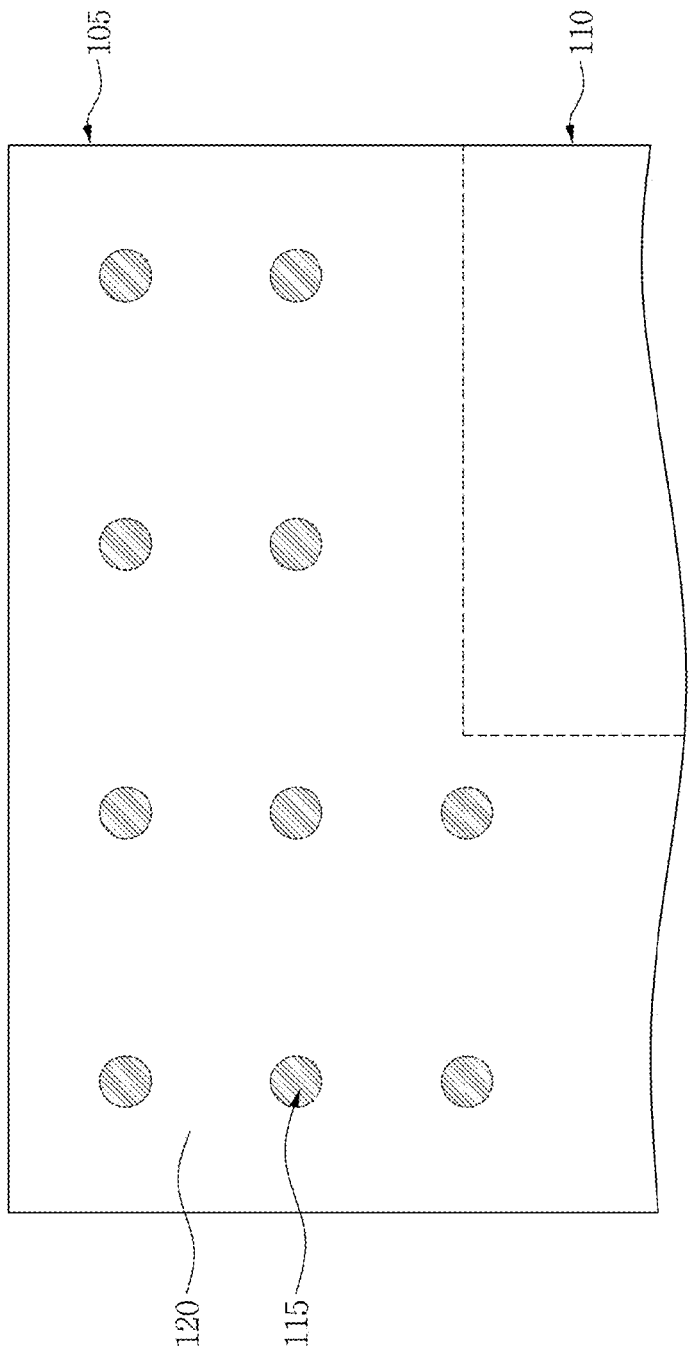

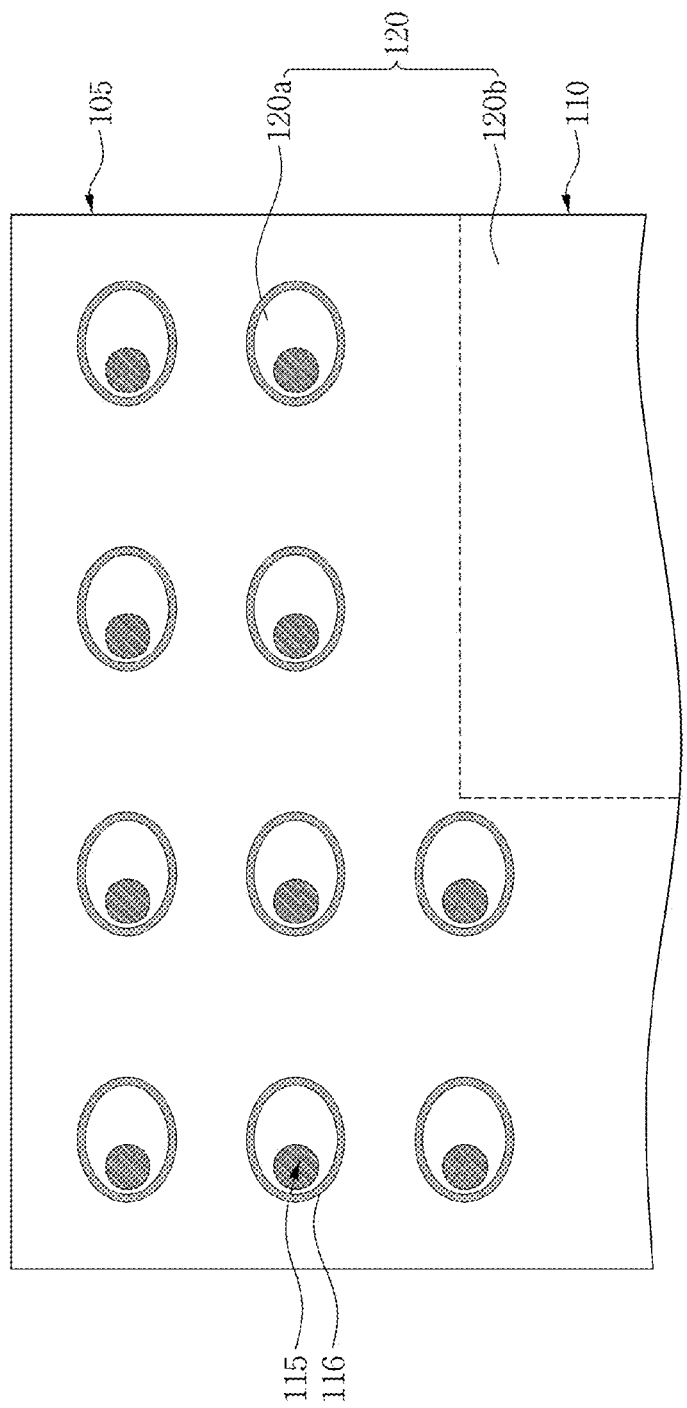

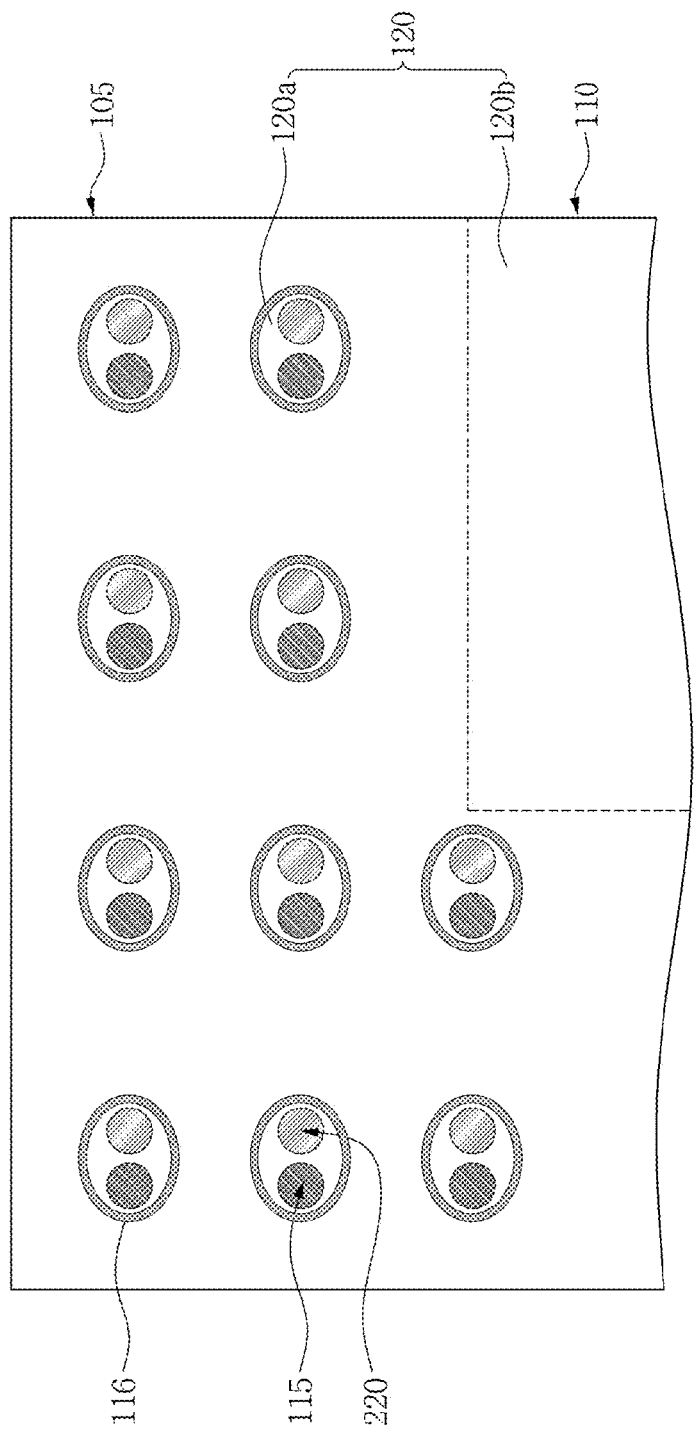

STACK-TYPE SEMICONDUCTOR PACKAGE

CROSS-REFERENCE TO RELATED APPLICATION

This application claims priority under 35 U.S.C. §119 to Korean Patent Application No. 10-2013-0115475, filed on Sep. 27, 2013, the disclosure of which is hereby incorporated by reference in its entirety.

BACKGROUND

1. Field

Example embodiments of inventive concepts relate to a stack-type semiconductor package, a method of fabricating the stack-type semiconductor package, a semiconductor module, an electronic circuit board, and/or an electronic system including the stack-type semiconductor package.

2. Description of Related Art

To improve the integration density of semiconductor devices and downscale electronic circuit systems, a package stack structure has been proposed.

SUMMARY

Example embodiments of inventive concepts relate to a stack-type semiconductor package capable of embodying a fine ball pitch.

Example embodiments of inventive concepts relate to a stack-type semiconductor package having high reliability.

In accordance with example embodiments of inventive concepts, a stack-type semiconductor package includes a lower semiconductor package, an upper semiconductor package, connection pads electrically connecting the lower semiconductor package and the upper semiconductor package, and a metal layer pattern. The lower semiconductor package includes a lower package substrate, a lower semiconductor chip on a top surface of the lower package substrate, lower solder balls on the top surface of the lower package substrate in a vicinity of the lower semiconductor chip, and an encapsulant on the top surface of the lower package substrate. The encapsulant defines via holes that expose the lower solder balls. The upper semiconductor package is on the encapsulant. The upper semiconductor package includes upper solder balls connected to a bottom surface of the upper semiconductor package. The connection pads are on the via holes and the encapsulant. The connection pads electrically connect the lower semiconductor package to the upper semiconductor package. The metal layer pattern is between the lower package substrate and the upper semiconductor package. The metal layer pattern surrounds the connection pads and is isolated from the connection pads.

In example embodiments, a same metal layer may define the metal layer pattern and the connection pads.

In example embodiments, the connection pads may be electrically connected to the lower solder balls through the via holes, and the connection pads may be electrically connected to the upper solder balls on the encapsulant.

In example embodiments, each one of the connection pads may conformally cover both sidewalls of a corresponding one of the via holes, exposed surfaces of a corresponding one of the lower solder balls, and the encapsulant.

In example embodiments, each one of the connection pads may fill a corresponding one of the via holes.

In example embodiments, in a plan view, each of the connection pads has an area covering a corresponding one of the lower solder balls and a corresponding one of the upper solder balls.

In example embodiments, the stack-type semiconductor package may further include redistribution patterns electrically connected to the upper solder balls and the connection pads. The redistribution patterns and the connection pads may be defined from a same metal layer.

In example embodiments, the redistribution patterns may be on a top surface of the lower semiconductor chip.

In example embodiments, the upper solder balls may be on the lower semiconductor chip.

In accordance with example embodiments of inventive concepts, a stack-type semiconductor package includes a lower semiconductor package, an upper semiconductor package, connection pads, and a metal layer pattern. The lower semiconductor package includes a lower package substrate, lower lands on the lower package substrate, a lower semiconductor chip on a top surface of the lower package substrate, and an encapsulant on the top surface of the lower package substrate. The encapsulant defines via holes that expose the lower lands. The upper semiconductor package is on the encapsulant and includes upper solder balls connected to a bottom surface of the upper semiconductor package. The connection pads are on the via holes and the encapsulant. The connection pads electrically connect the lower semiconductor package to the upper semiconductor package. The metal layer pattern is between the lower package substrate and the upper semiconductor package. The metal layer pattern surrounds the connection pads and is isolated from the connection pads.

In example embodiments, the connection pads may be electrically connected to the lower lands through the via holes, and the connection pads may be electrically connected to the upper solder balls on the encapsulant.

In example embodiments, a same metal layer may define the metal layer pattern and the connection pads.

In example embodiments, in a plan view, each of the connection pads may have an area covering an exposed surface of a corresponding one of the lower lands and a corresponding one of the upper solder balls.

In example embodiments, the stack-type semiconductor package may further include redistribution patterns. The redistribution patterns may electrically connect the upper solder balls to the connection pads. A same metal layer may define the redistribution patterns and the connection pads.

In example embodiments, the redistribution patterns may be on a top surface of the lower semiconductor chip, and the upper solder balls may be on the lower semiconductor chip.

According to example embodiments, a stack-type semiconductor package may include a lower package substrate, lower lands on the lower package substrate and surrounding a portion of the substrate, a lower semiconductor chip on the portion of the lower package substrate, an encapsulant on the lower package substrate, a metal layer pattern on the encapsulant and over at least part of the portion of the lower package substrate, and upper package substrate on the lower package substrate, and connection pads electrically isolated from the metal layer pattern. The encapsulant surrounds the lower semiconductor chip and defines via holes that expose the lower land. The upper semiconductor package includes upper solder balls connected to a bottom surface of the upper semiconductor package. The connection pads are electrically connected through the via holes to the lower lands, respectively, and the connection pads are electrically connected to the upper solder balls, respectively.

In example embodiments, lower solder balls may be in the via holes between the connection pads and the lower lands. Each one of the upper solder balls may be electrically connected to a corresponding one of the lower lands through a corresponding one of the connection pads and a corresponding one of the lower solder balls.

In example embodiments, a metal redistribution pattern may be on the lower semiconductor chip. The upper solder balls may be on the metal redistribution pattern and electrically connected to the metal redistribution pattern. The metal redistribution may be surrounded by the metal layer pattern and electrically isolated from the metal layer pattern. The metal redistribution pattern may electric connected each one of the upper solder balls to a corresponding one of the connection pads.

In example embodiments, each one of the connection pads may be directly connected to a corresponding one of the lower lands.

In example embodiments, a same metal layer on a top surface of the encapsulant may define the metal layer pattern and the connection pads.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF EXAMPLE EMBODIMENTS

Figure 1:
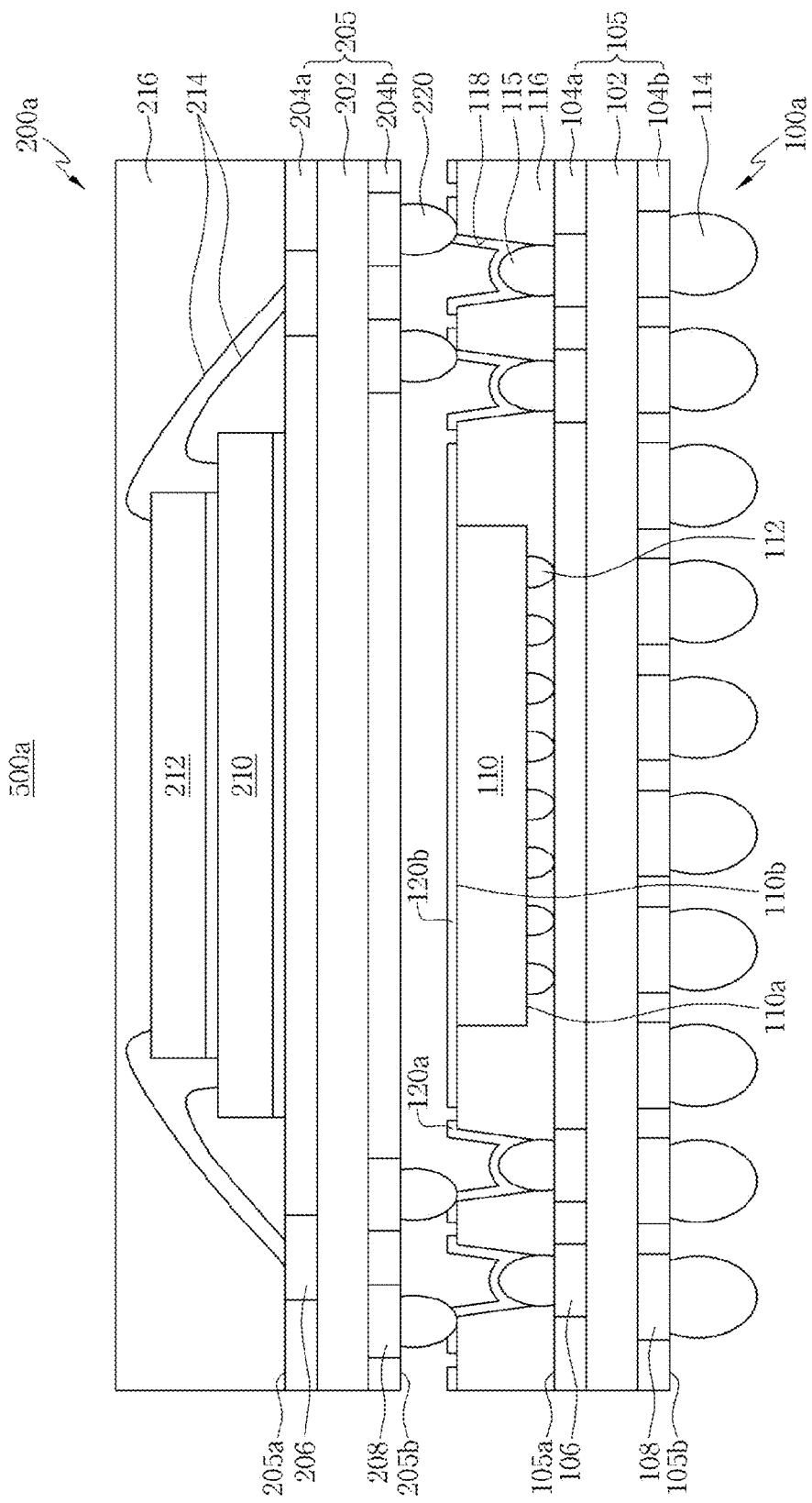
FIG. 1 is a cross-sectional view of a stack-type semiconductor package according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising,", when used herein, specify the presence of stated features, integers, steps, operations, elements, and/or components, but do not preclude the presence or addition of one or more other features, integers, steps, operations, elements, components, and/or groups thereof.

Spatially relative terms, such as "top end", "bottom end", "top surface", "bottom surface", "upper", and "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that, although the terms first, second, etc. may be used herein to describe various elements, components, regions, layers and/or sections, these elements, components, regions, layers and/or sections should not be limited by these terms. These terms are only used to distinguish one element from another. Thus, a first element, component, region, layer or section discussed below could be termed a second element, component, region, layer or section without departing from the teachings of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
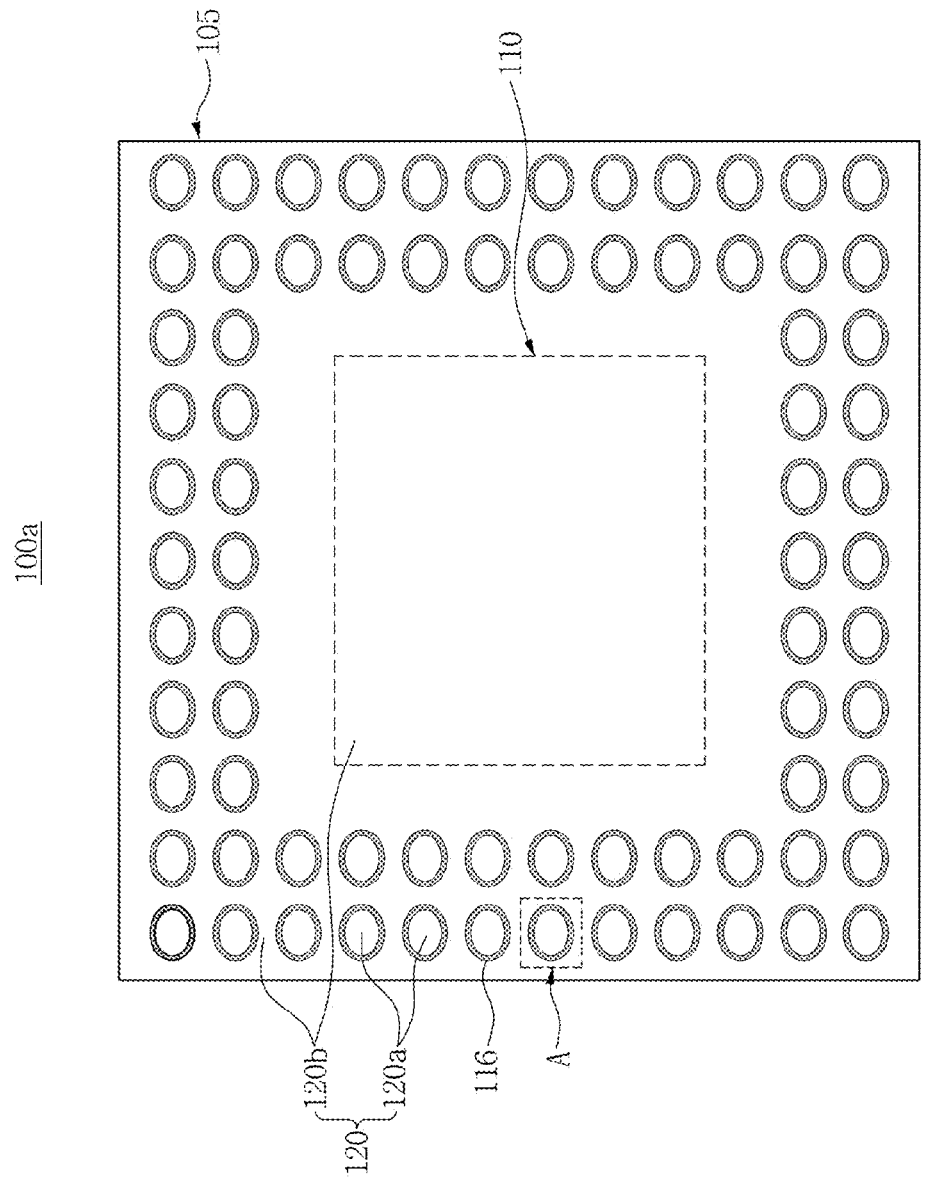
FIG. 2 is a plan view of a lower package substrate of FIG. 1.
Figure 3:
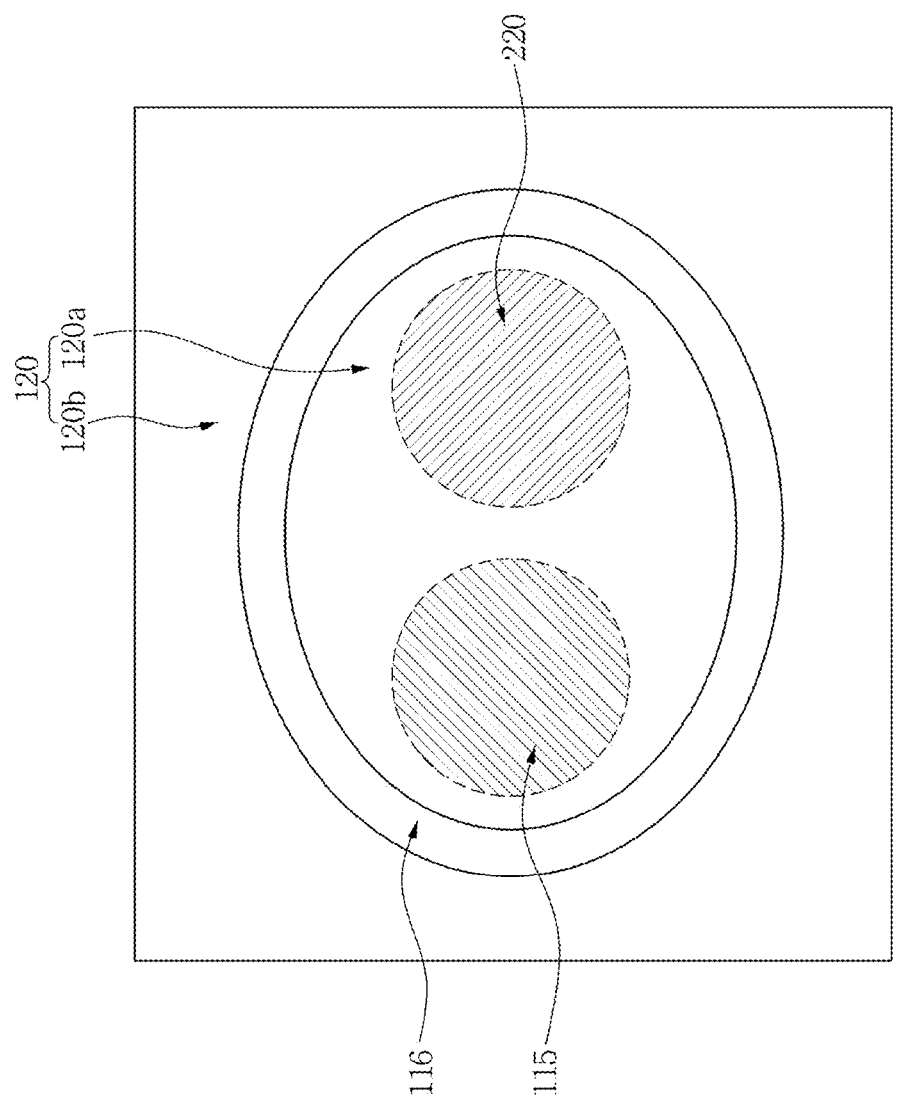
FIG. 3 is an enlarged view of portion A of FIG. 2.

FIG. 1 is a cross-sectional view of a stack-type semiconductor package 500a according to example embodiments of inventive concepts, FIG. 2 is a plan view of a lower package substrate of FIG. 1, and FIG. 3 is an enlarged view of portion A of FIG. 2.

Referring to FIGS. 1, 2, and 3, the stack-type semiconductor package 500a according to example embodiments of inventive concepts may include a lower semiconductor package 100a and an upper semiconductor package 200a.

The stack-type semiconductor package 500a may have a package-on-package (POP) structure in which the upper semiconductor package 200a is stacked on the lower semiconductor package 100a. The lower semiconductor package 100a and the upper semiconductor package 200a may be packages, each of which has finished a packaging process and an electrical test.

The lower semiconductor package 100a may include a lower package substrate 105 and a lower semiconductor chip 110 mounted on the lower package substrate 105.

The lower package substrate 105 may be a substrate on which a plurality of lower lines are formed. The lower package substrate 105 may include a rigid printed circuit board (rigid PCB), a flexible PCB, or a rigid-flexible PCB. A rigid-flexible PCB may include a rigid area and a flexible area, and the flexible area may be connected to the rigid area. A rigid-flexible PCB may be used in electronic devices such as notebook computers, PDAs, and wearable devices, but example embodiments are not limited thereto. The lower package substrate 105 may include a lower core layer 102 and lower solder resist layers 104a and 104b. The plurality of lower lines may be formed in the lower core layer 102 constituting the lower package substrate 105. A ground voltage and a power supply voltage may be applied to the plurality of lower lines.

First lower lands 106 may be formed on a top surface 105a of the lower package substrate 105 and electrically insulated from one another by the first lower solder resist layer 104a. Second lower lands 108 may be formed on a bottom surface 105b of the lower package substrate 105 and electrically insulated from one another by the second lower solder resist layer 104b. The first lower lands 106 may be electrically connected to the second lower lands 108 by the lower lines. The first and second lower lands 106 and 108 may each include at least one metal such as copper (Cu), nickel (Ni), gold (Au), and combinations thereof, or a solder material. A material of the first lower lands 106 may be the same as or different than a material of the second lower lands 108.

External connection members 114 may be formed on the second lower lands 108 to electrically connect the stack-type semiconductor package 500 to a semiconductor module board or a system board. The external connection members 114 may include a solder material, such as solder balls, solder bumps, or a solder paste, or include a spherical metal, a mesa-shaped metal, or a pin-shaped metal. The external connection members 114 may be arranged as a grid type to embody a ball grid array (BGA) package.

The lower semiconductor chip 110 may include a logic device, such as a microprocessor (MP), a microcontroller (MC), or an application processor (AP). The lower semiconductor chip 110 may be a system-on chip (SOC) in which different kinds of semiconductor devices are disposed in a single semiconductor chip.

The lower semiconductor chip 110 may be connected to the lower package substrate 105 using a flip-chip technique. For example, the lower semiconductor chip 110 may be a flip-chip package (FCP) in which an active surface 110a including chip pads is disposed opposite the top surface 105a of the lower package substrate 105, and directly connected onto the lower package substrate 105 using conductive chip bumps 112 adhered to the chip pads. The chip pads formed on the active region 110a of the lower semiconductor chip 110 may be electrically connected to the first lower lands 106 by the chip bumps 112 and the lower lines. The chip bumps 112 may include a solder material or at least one metal, such as gold (Au), silver (Ag), platinum (Pt), aluminum (Al), copper (Cu), or nickel (Ni) and combinations thereof. When each of the chip bumps 112 is a solder bump, each of the chip bumps 112 may maintain a ball shape due to a surface tension effect. In comparison, when each of the chip bumps 112 is a metal bump, each of the chip bumps 112 may be formed as a mesa type.

The lower semiconductor package 100a may include lower solder balls 115 formed on the first lower lands 106 of the lower package substrate 105, and a lower encapsulant 116 formed on the entire surface of the lower package substrate 105 and having via holes 118 exposing the lower solder balls 115.

The lower solder balls 115 may be formed in the same arrangement as the first lower lands 106. The lower solder balls 115 may be formed at a lower level than top surfaces of the via holes 118.

The lower encapsulant 116 may be formed to surround the lower semiconductor chip 110 and the chip bumps 112 to protect an electrical connection between the lower semiconductor chip 110 and the lower package substrate 105. Also, the lower encapsulant 116 may reduce stress applied to the top surface 105a of the lower package substrate 105. A top surface 110b disposed opposite to the active surface 110a of the lower semiconductor chip 110 may not be covered with the lower encapsulant 116. The lower encapsulant 116 may expose the top surface 110b of the lower semiconductor chip 110 and reduce the entire height of the stack-type semiconductor package 500a. The lower encapsulant 116 may include an epoxy resin or an epoxy mold compound (EMC), but example embodiments are not limited thereto. When necessary, the lower encapsulant 116 may be formed on the bottom surface 105b of the lower package substrate 105 and protect the second lower solder resist layer 104b and stably support the external connection members 114.

The upper semiconductor package 200a may be vertically stacked on the lower semiconductor package 100a and include an upper package substrate 205 and at least one of upper semiconductor chips 210 and 212 mounted on the upper package substrate 205. The upper semiconductor package 200a may be a multi-chip package (MCP) in which a plurality of semiconductor chips are vertically stacked on each other. Alternatively, the upper semiconductor package 200a may have a structure in which a plurality of semiconductor chips are vertically stacked on a plurality of semiconductor chips disposed at a level.

The upper package substrate 205 may be a substrate including a plurality of upper lines, which may include a rigid PCB, a flexible PCB, or a rigid-flexible PCB. The upper package substrate 205 may include an upper core layer 202 and upper solder resist layers 204a and 204b. The plurality of upper lines may be formed in the upper core layer 202 constituting the upper package substrate 205. A ground voltage and a power supply voltage may be applied to the plurality of upper lines.

First upper lands 206 may be formed on a top surface 205a of the upper package substrate 205 and electrically insulated from one another by a first upper solder resist layer 204a. Second upper lands 208 may be formed on a bottom surface 205b of the upper package substrate 205 and electrically insulated from one another by a second upper solder resist layer 204b. The first upper lands 206 may be connected to the second upper lands 208a by the upper lines. The first and second upper lands 206 and 208 may include a solder material or at least one metal, such as copper, nickel, or gold and a combination thereof. Only one first upper land 206 at each end of the upper package substrate 205 is illustrated in FIG. 1 for brevity, but example embodiments are not limited thereto. Each end of the upper package substrate 205 may include a plurality of first upper lands 206.

The upper semiconductor chips 210 and 212 may include memory devices. The upper semiconductor chips 210 and 212 may be connected to the upper package substrate 205 using a wire bonding technique or a flip-chip technique. For example, chips pads formed on active surfaces of the upper semiconductor chips 210 and 212 may be connected to the first upper lands 206 of the upper package substrate 205 by wires 214. Although FIG. 1 illustrates that the upper semiconductor chips 210 and 212 are connected to the upper package substrate 205 using a wire bonding technique, the upper semiconductor chips 210 and 212 alternatively may be directly connected to the upper package substrate 205 using a flip-chip technique.

The upper semiconductor package 200a may further include an upper encapsulant 216, which may be formed on the entire surface of the upper package substrate 205 and protect the active surfaces of the upper semiconductor chips 210 and 212 and the wires 214. The upper encapsulant 214 may include an epoxy resin or an EMC, but example embodiments are not limited thereto.

The lower semiconductor package 100a of the stack-type semiconductor package 500a according to example embodiments of inventive concepts may include connection pads 120a formed on the via holes 118 and the lower encapsulant 116.

The connection pads 120a may be conformally formed on both sidewalls of the via holes 118, exposed surfaces of the lower solder balls 115, and the lower encapsulant 116. From a plan view of FIG. 3, each of the connection pads 120a may be formed to have an area covering the lower solder ball 115 and an upper solder ball 220. Each of the connection pads 120a may be in direct contact with the lower solder ball 115 of the lower package substrate 105 through the via hole 115, and in direct contact with the upper solder ball 220 of the upper package substrate 205 on the lower encapsulant 116. Thus, each of the connection pads 120a may serve as an electrical path between the lower semiconductor package 100*a* and the upper semiconductor package 200*a*. The upper solder balls 220 may be laterally spaced apart from the lower solder balls 115 by a desired (and/or alternative predetermined) distance in consideration of solder reflow during a solder joint process for bonding the upper solder balls 220 with the connection pads 120*a*.

Even if the size of the lower solder balls 115 is reduced to embody a fine ball pitch, since the upper solder balls 220 are in direct contact with the connection pads 120*a*, the upper solder balls 220 may be electrically connected to the lower solder balls 115 by the connection pads 120*a*. Accordingly, a stack-type semiconductor package having a fine ball pitch of about 0.2 mm or less may be embodied.

The lower semiconductor package 100*a* of the stack-type semiconductor package 500*a* according to example embodiments of inventive concepts may include a metal layer pattern 120*b* formed on the entire surface of the lower package substrate 105.

The metal layer pattern 120*b* may be formed in the same layer as the connection pads 120*a*, and isolated from the connection pads 120*a* as shown in FIG. 3. The connection pads 120*a* and the metal layer pattern 120*b* may include a metal layer 120 deposited on the entire surface of the lower package substrate 105. The metal layer 120 may include at least one metal such as copper, nickel, aluminum, gold, silver, or an alloy thereof.

Since the metal layer pattern 120*b* functions as a heat sink configured to externally effectively dissipate a large amount of heat generated during the driving of the lower semiconductor chip 110, the metal layer pattern 120*b* may increase heat radiation efficiency of the stack-type semiconductor package 500*a* and limit (and/or prevent) operational errors due to overheating. Also, since the metal layer pattern 120*b* functions as an electromagnetic interference (EMI) shield layer, the reliability and/or durability of the stack-type semiconductor package 500*a* may be improved.

Hereinafter, stack-type semiconductor packages according to example embodiments of inventive concepts will be described. Here, the differences compared to the semiconductor package according to example embodiments in FIGS. 1-3 will chiefly be described.

Figure 4:
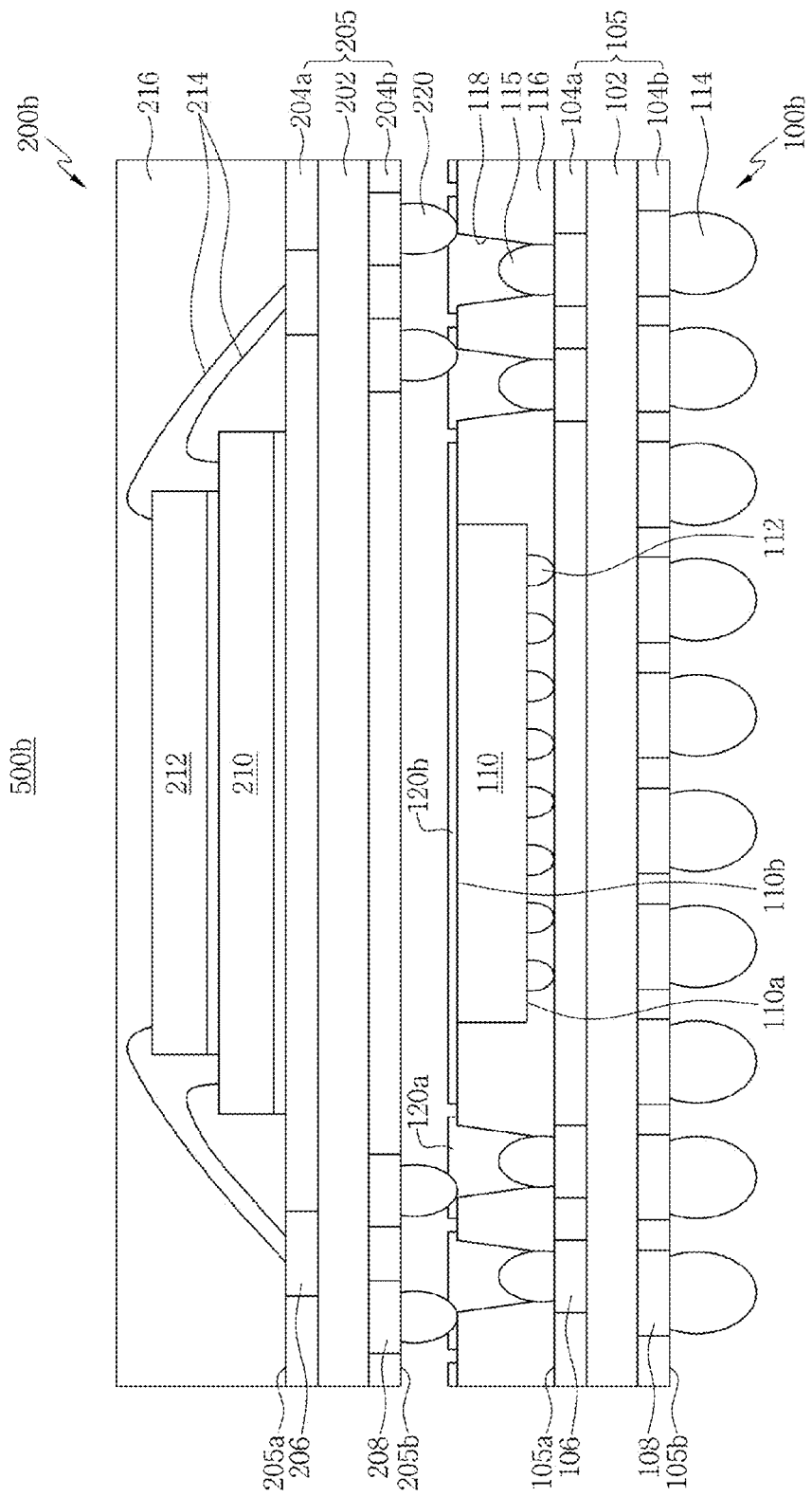
FIG. 4 is a cross-sectional view of a stack-type semiconductor package according to example embodiments of inventive concepts.
Figure 5:
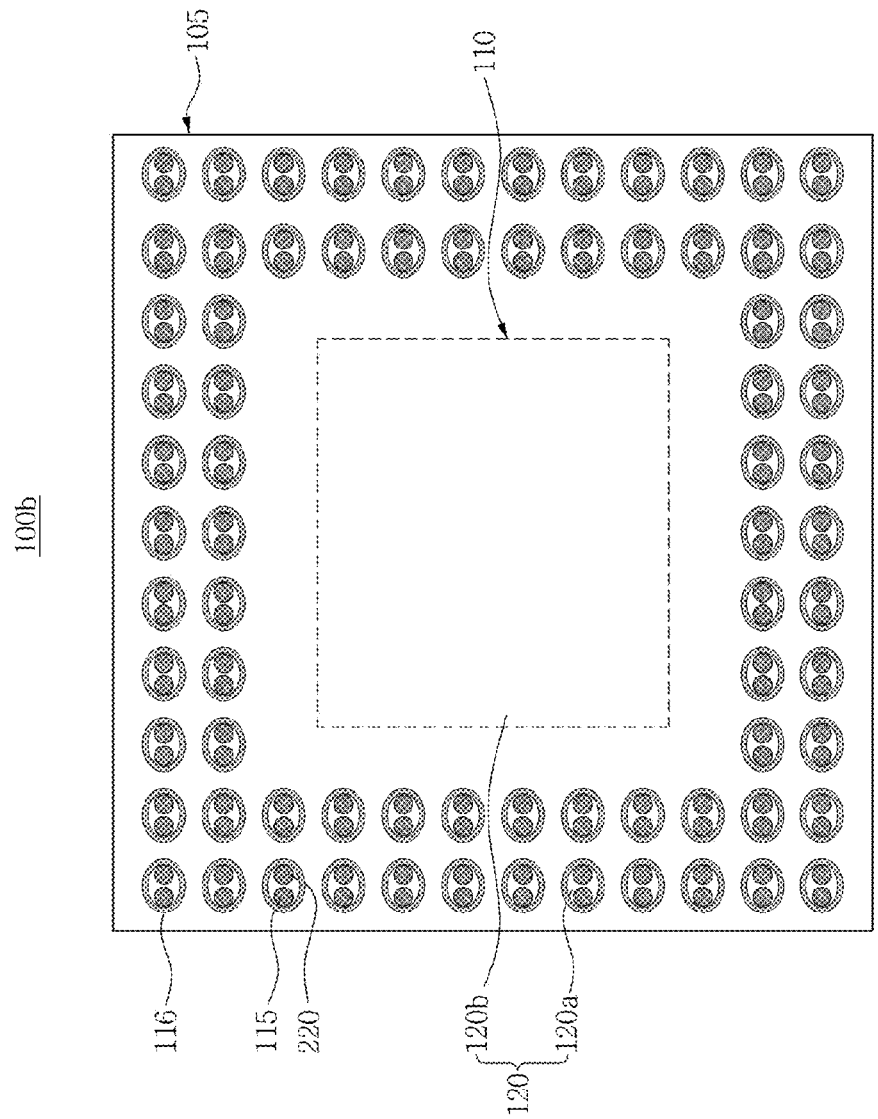
FIG. 5 is a plan view of a lower package substrate of FIG. 4.

FIG. 4 is a cross-sectional view of a stack-type semiconductor package 500*b* according to example embodiments of inventive concepts, and FIG. 5 is a plan view of a lower package substrate shown in FIG. 4.

Referring to FIGS. 4 and 5, the stack-type semiconductor package 500*b* according to example embodiments of inventive concepts may have the same structure and effects as the stack-type semiconductor package 500*a* shown in FIG. 1 except that connection pads 120*a* are formed to fill via holes 118.

From a plan view of FIG. 5, each of the connection pads 120*a* may be formed to have an area covering the lower solder ball 115 and an upper solder ball 220.

Figure 6:
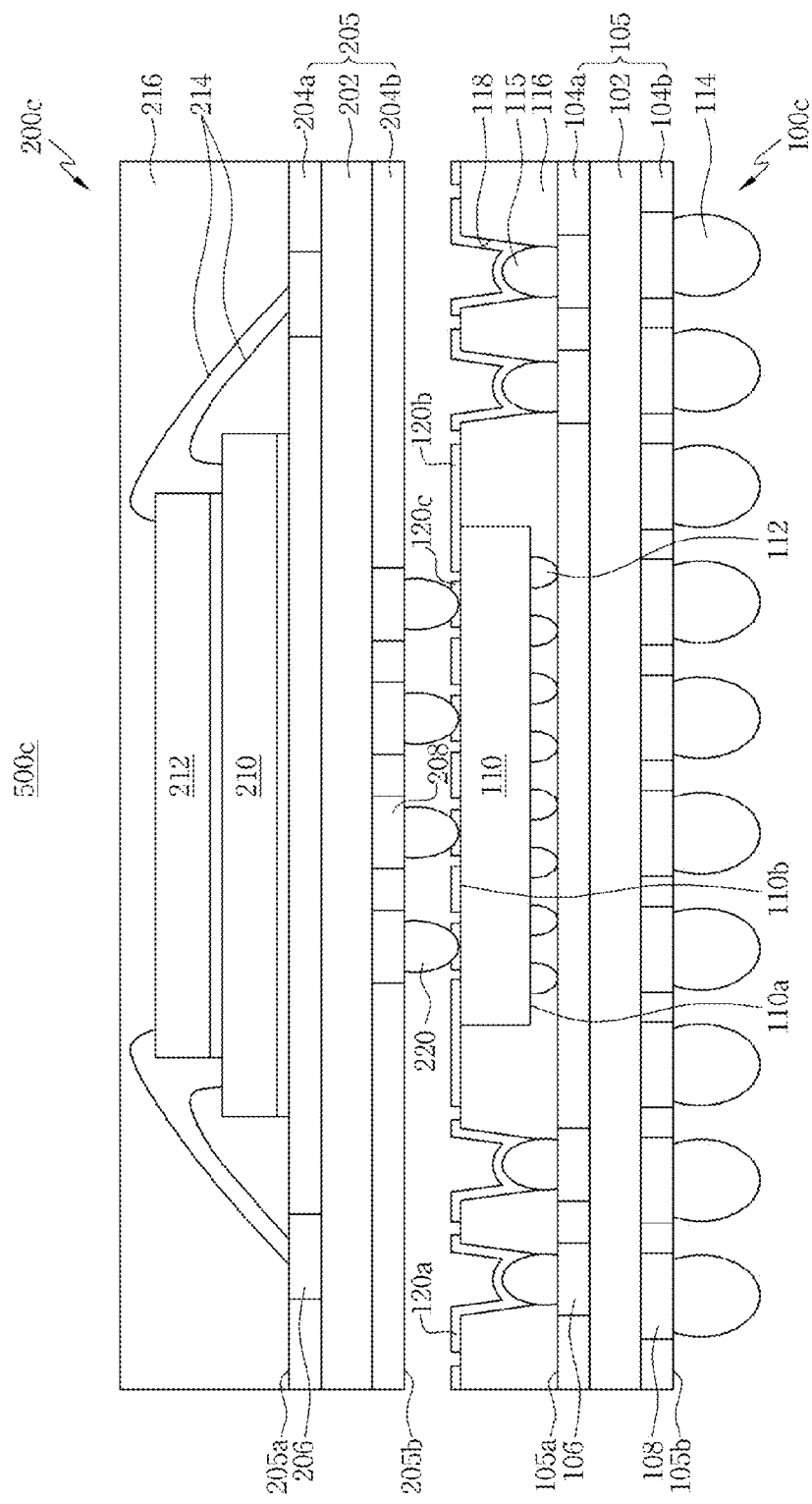
FIG. 6 is a cross-sectional view of a stack-type semiconductor package according to example embodiments of inventive concepts.
Figure 7:
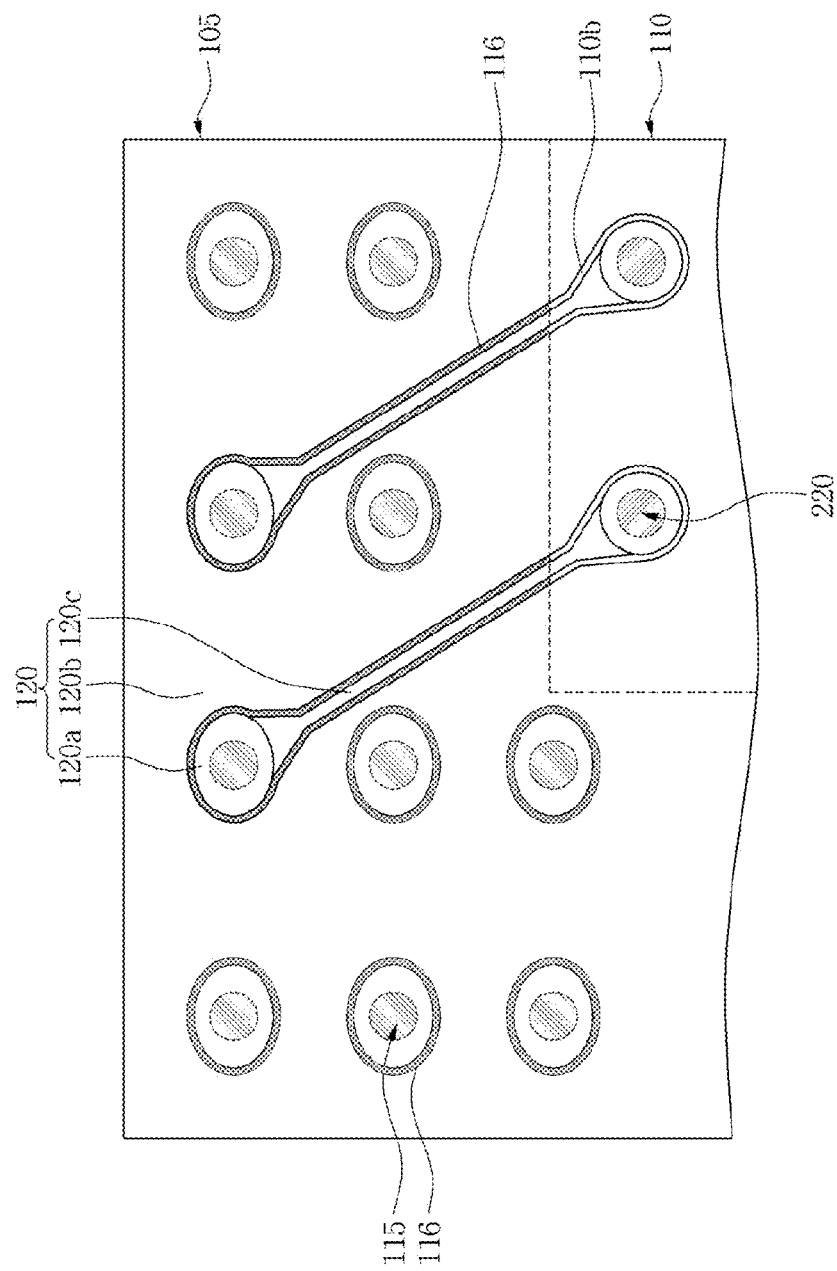
FIG. 7 is a plan view of a portion of a lower package substrate of FIG. 6.

FIG. 6 is a cross-sectional view of a stack-type semiconductor package 500*c* according to example embodiments of inventive concepts, and FIG. 7 is a plan view of a portion of a lower package substrate of FIG. 6.

Referring to FIGS. 6 and 7, the stack-type semiconductor package 500*c* according to example embodiments of inventive concepts may include a lower semiconductor package 100*c* and an upper semiconductor package 200*c*. The lower semiconductor package 100*c* may include a lower package substrate 105, a lower semiconductor chip 110 formed on a top surface 105*a* of the lower package substrate 105, lower solder balls 115 formed on the top surface 105*a* of the lower package substrate 105 in the vicinity of the lower semiconductor chip 110, and a lower encapsulant 116 formed on the top surface 105*a* of the lower package substrate 105 and having via holes 118 exposing the lower solder balls 115. The upper semiconductor package 200*c* may be disposed on the lower encapsulant 116 and have upper solder balls 220 disposed on a bottom surface 205*b* of an upper package substrate 205.

The stack-type semiconductor package 500*c* may include connection pads 120*a* formed on the via holes 118 and the lower encapsulant 116 and configured to electrically connect the lower semiconductor package 100*c* and the upper semiconductor package 200*c*, and a metal layer pattern 120*b* formed on the entire surface of the lower package substrate 105 and isolated from the connection pads 120*a*.

The stack-type semiconductor package 500*c* may include redistribution patterns 120*c* formed in the same metal layer 120 as the connection pads 120*a* and configured to electrically connect the upper solder balls 220 and the connection pads 120*a*.

As shown in FIG. 7, each of the redistribution patterns 120*c* may be connected to the connection pad 120*a* and serve to electrically extend the connection pad 120*a* along the redistribution pattern 120*c*.

The redistribution patterns 120*c* may be formed on a top surface 110*b* of the lower semiconductor chip 110. In this case, the upper solder balls 220 may be disposed over the lower semiconductor chip 110, and be widely disposed on a bottom surface 205*b* of the upper package substrate 205. Accordingly, a degree of freedom of design for the upper solder balls 220 may be increased.

Figure 8:
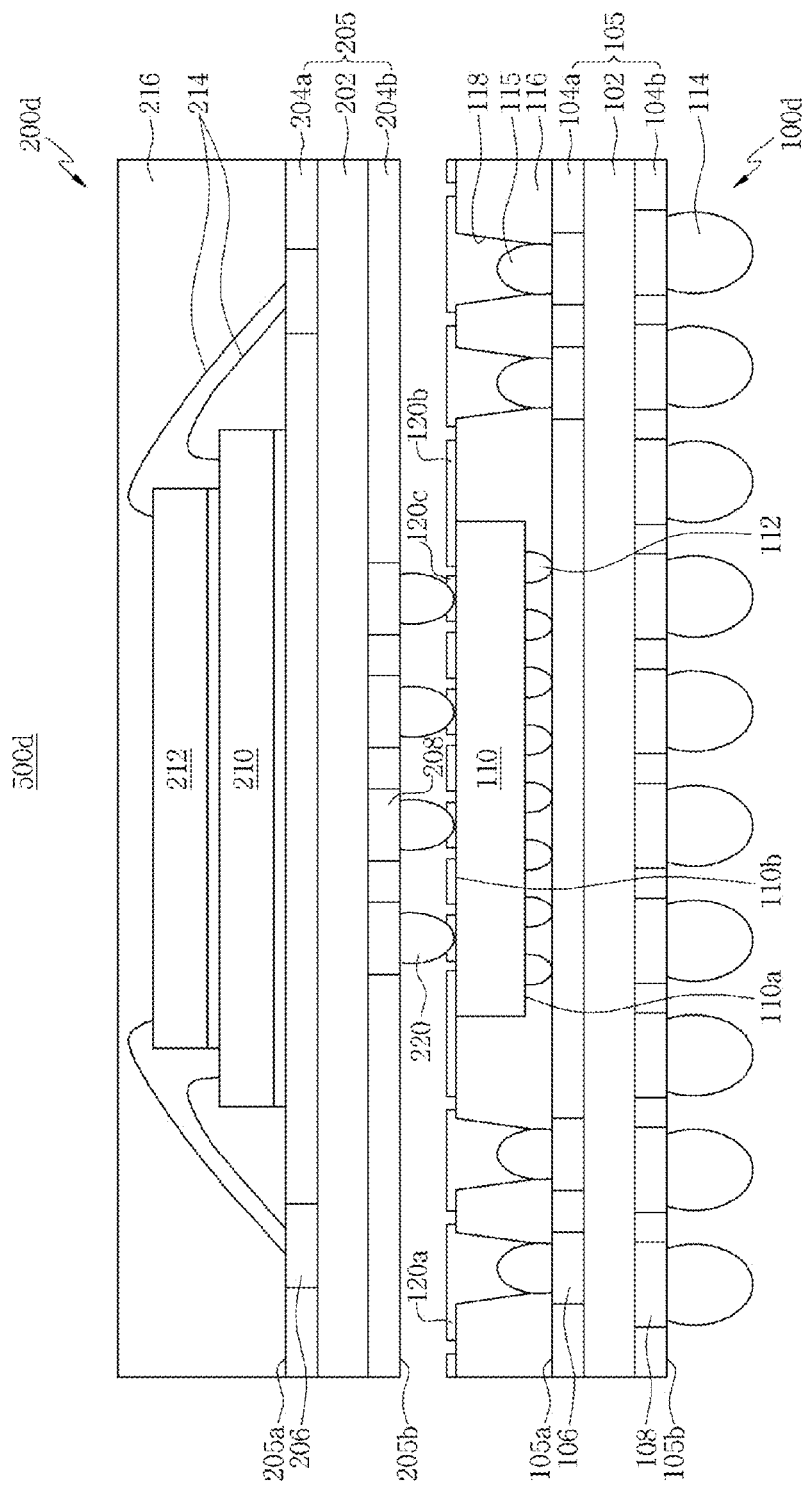
FIG. 8 is a cross-sectional view of a stack-type semiconductor package according to example embodiments of inventive concepts.

FIG. 8 is a cross-sectional view of a stack-type semiconductor package 500*d* according to example embodiments of inventive concepts.

Referring to FIG. 8, the stack-type semiconductor package 500*d* according to example embodiments of inventive concepts may have the same structure and effects as the stack-type semiconductor package 500*c* shown in FIG. 6 except that connection pads 120*a* are formed to fill via holes 118.

Figure 9:
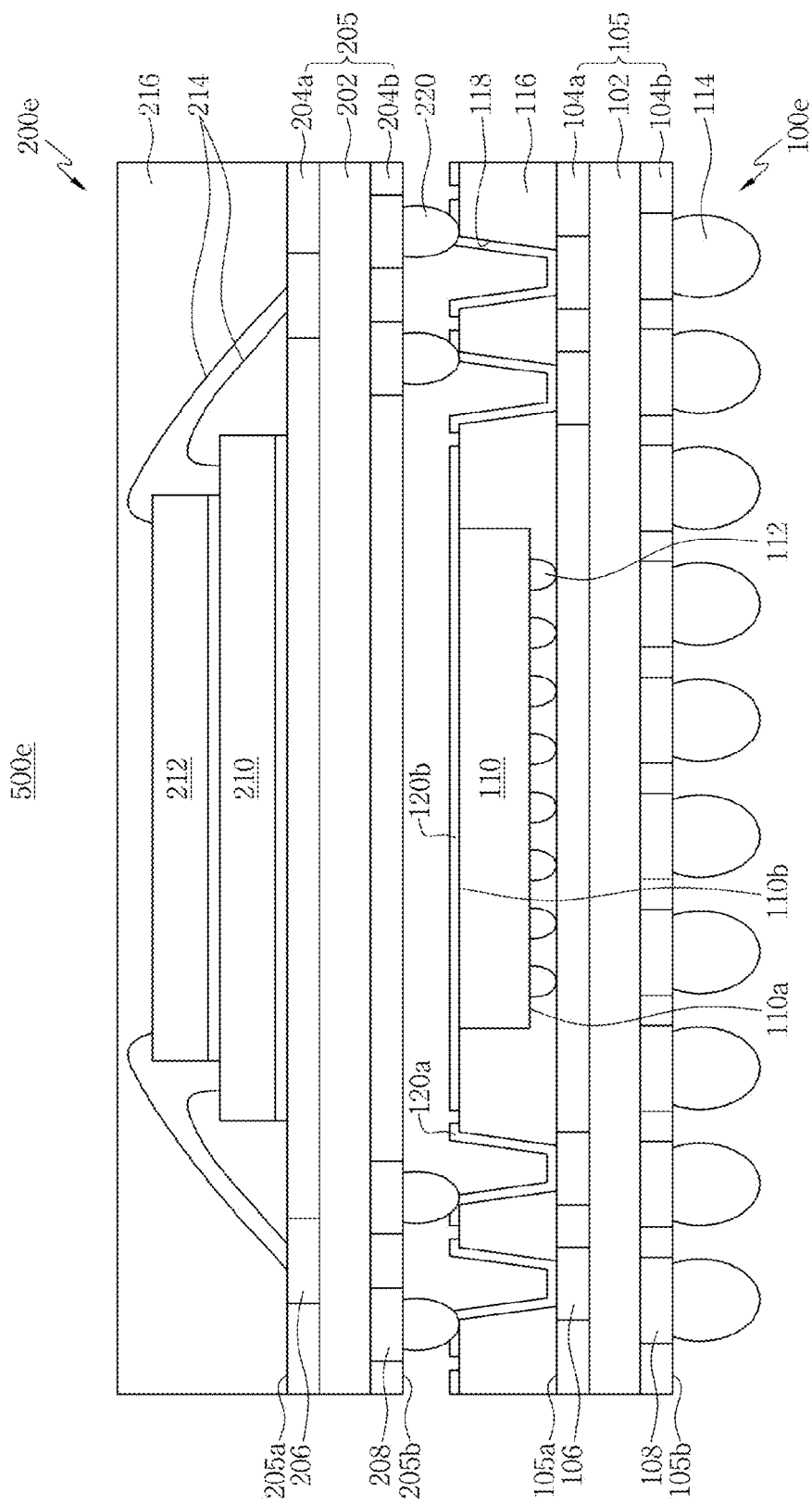
FIG. 9 is a cross-sectional view of a stack-type semiconductor package according to example embodiments of inventive concepts.
Figure 10:
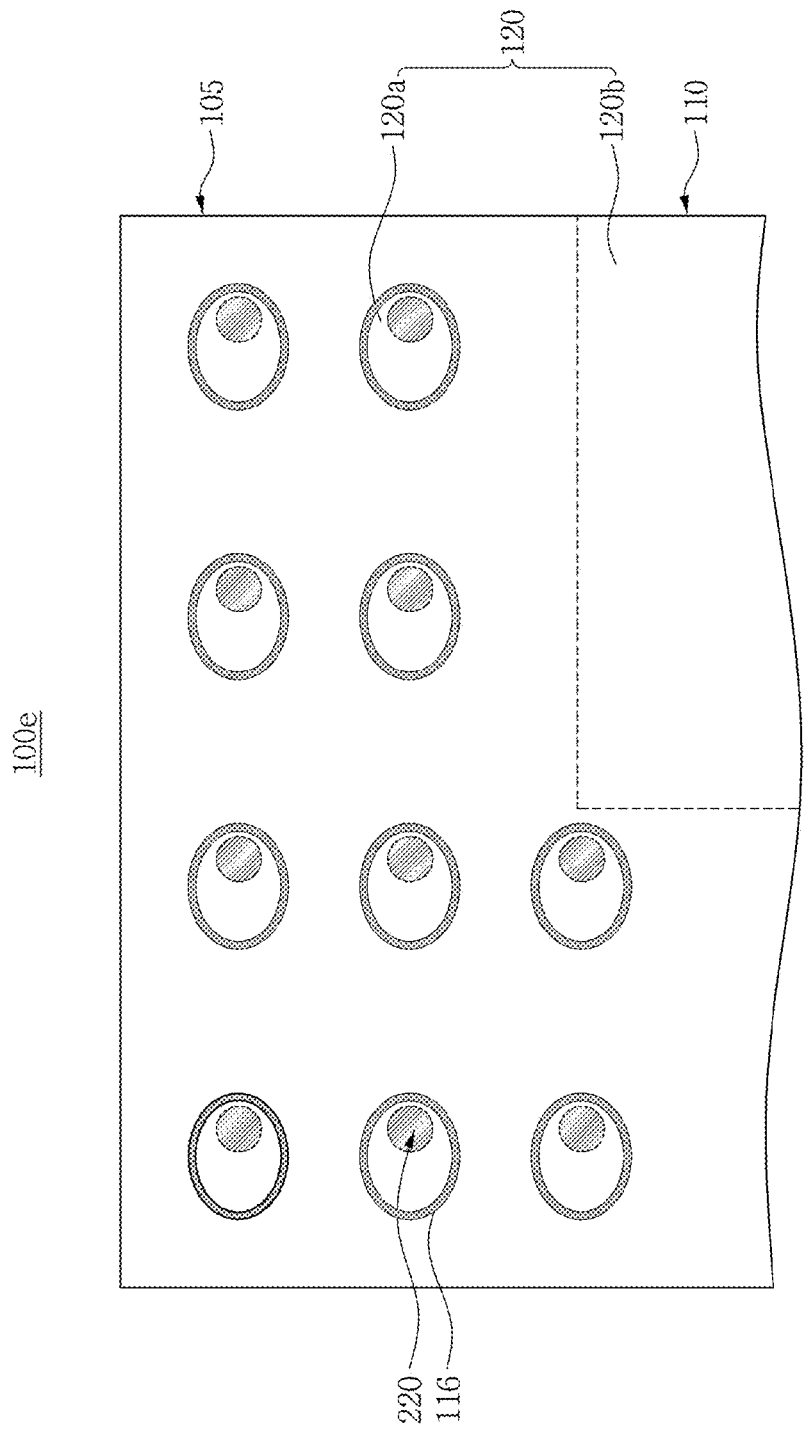
FIG. 10 is a plan view of a portion of a lower package substrate of FIG. 9.

FIG. 9 is a cross-sectional view of a stack-type semiconductor package 500*e* according to example embodiments of inventive concepts, and FIG. 10 is a plan view of a portion of a lower package substrate of FIG. 9.

Referring to FIGS. 9 and 10, the stack-type semiconductor package 500*e* according to example embodiments of inventive concepts may include a lower semiconductor package 100*e* and an upper semiconductor package 200*e*. The lower semiconductor package 100*e* may include a lower package substrate 105 having a top surface 105*a* on which first lower lands 106 are formed, a lower semiconductor chip 110 mounted on a top surface 105*a* of the lower package substrate 105, and a lower encapsulant 116 formed on the top surface 105*a* of the lower package substrate 105 and having via holes 118 exposing the first lower lands 106. The upper semiconductor package 200*e* may be disposed on the lower encapsulant 116 and have upper solder balls 220 disposed on a bottom surface 205*b* of an upper package substrate 205. The stack-type semiconductor package 500*e* may include connection pads 120*a* formed on the via holes 118 and the lower encapsulant 116 and configured to electrically connect the lower semiconductor package 100*e* and the upper semiconductor package 200*e* and a metal layer pattern 120*b* formed on the entire surface of the lower package substrate 105.

The connection pads 120*a* may be conformally formed on both sidewalls of the via holes 118, exposed surfaces of the first lower lands 106, and the lower encapsulant 116. From a plan view of FIG. 10, each of the connection pads 120*a* may be formed to have an area covering an exposed region of the first lower land 106 and the upper solder ball 220.

Each of the connection pads 120*a* may be in direct contact with the first lower land 106 of the lower package substrate 105 through the via hole 115, and in direct contact with an upper solder ball 220 of the upper package substrate 205 on the lower encapsulant 116. Thus, each of the connection pads 120*a* may serve as an electrical path between the lower semiconductor package 100*e* and the upper semiconductor package 200*e*.

The metal layer pattern 120*b* may be formed in the same layer as the connection pads 120*a*, and isolated from the connection pads 120*a* as shown in FIG. 10. The metal layer pattern 120*b* may function as both a heat sink and an EMI shield layer.

Figure 11:
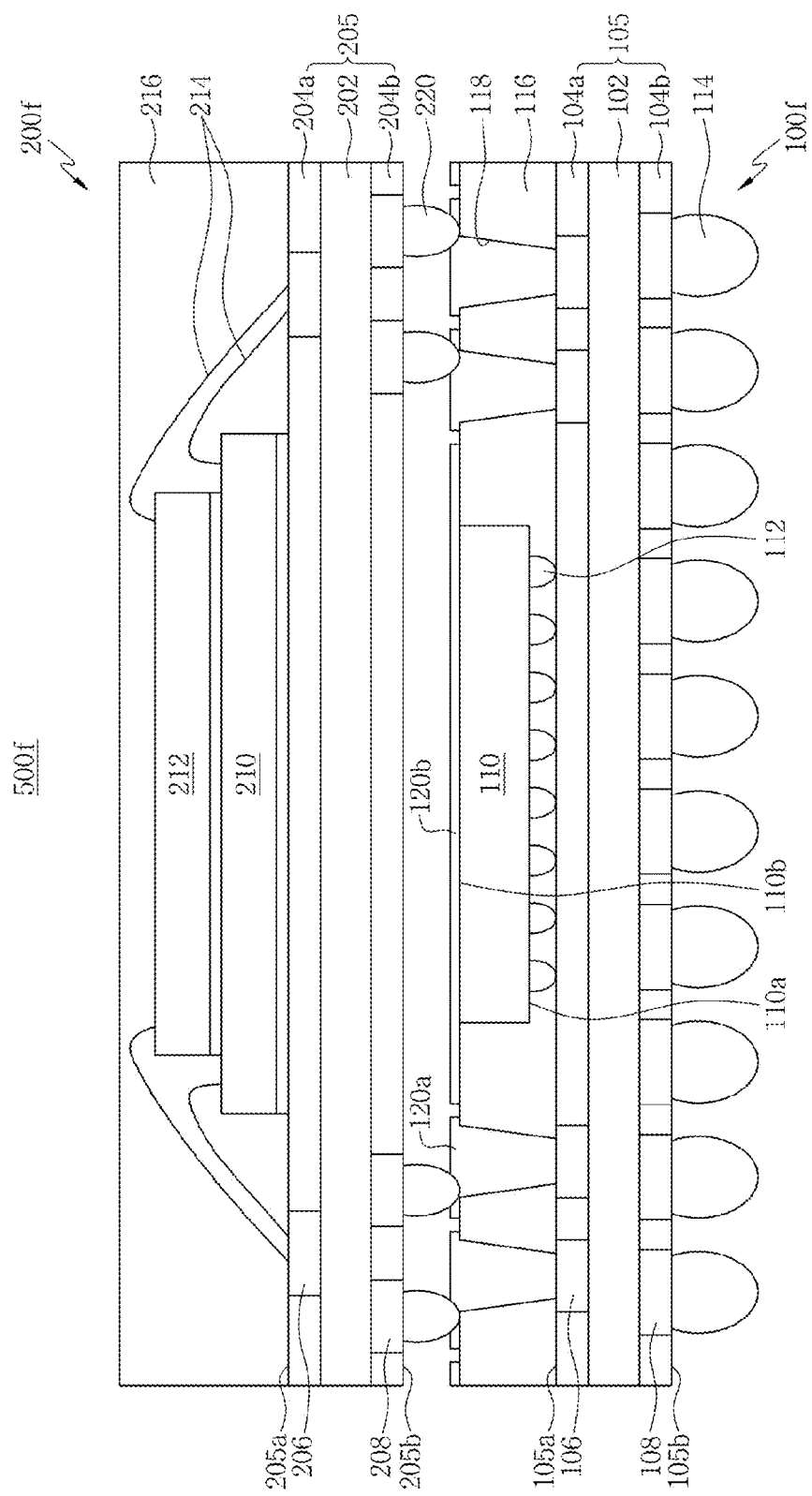
FIG. 11 is a cross-sectional view of a stack-type semiconductor package according to example embodiments of inventive concepts.

FIG. 11 is a cross-sectional view of a stack-type semiconductor package 500*f* according to example embodiments of inventive concepts.

Referring to FIG. 11, the stack-type semiconductor package 500*f* according to example embodiments of inventive concepts may have the same structure and effects as the stack-type semiconductor package 500*e* shown in FIG. 9 except that connection pads 120*a* are formed to fill via holes 118.

Figure 12:
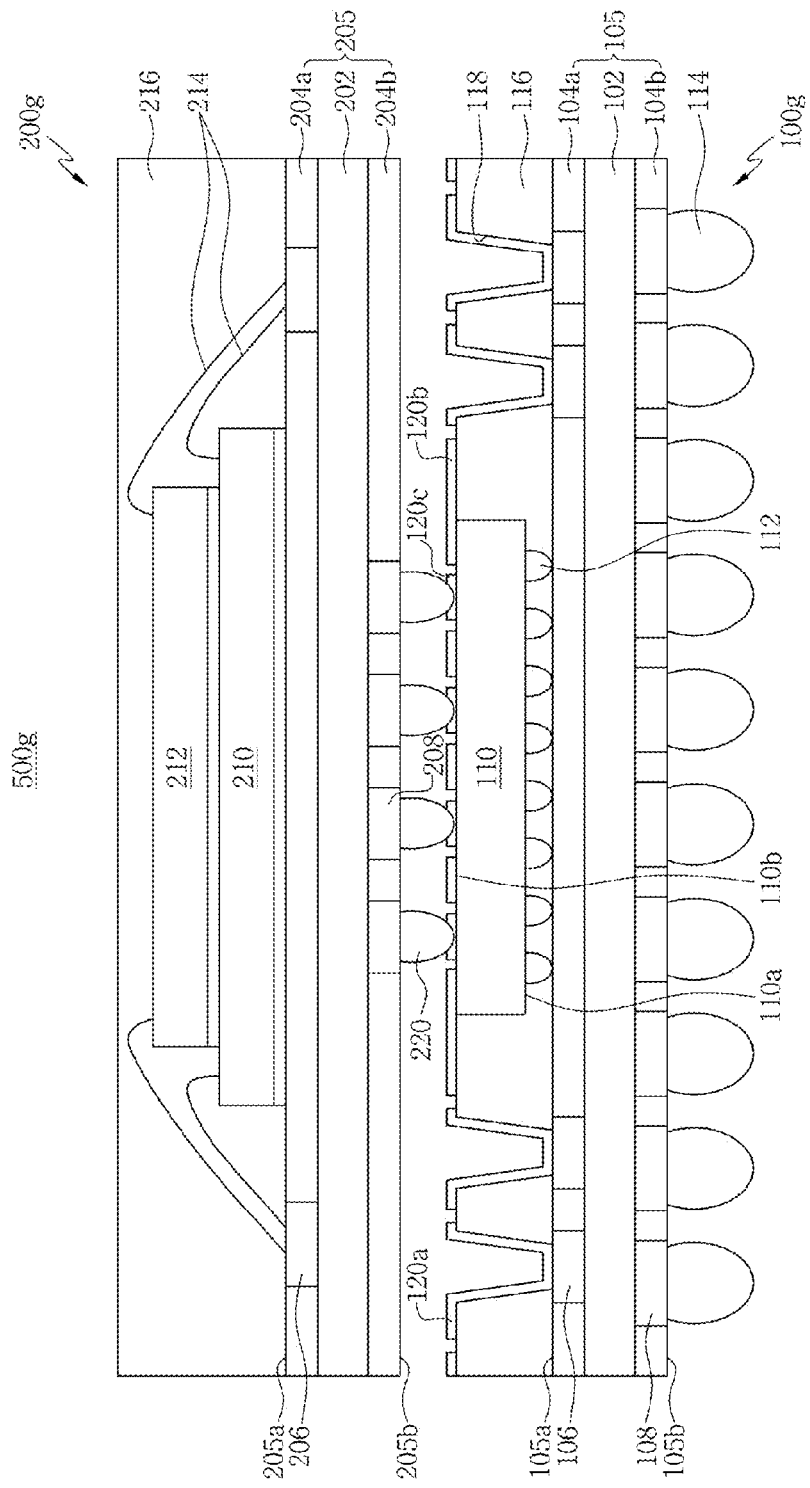
FIG. 12 is a cross-sectional view of a stack-type semiconductor package according to example embodiments of inventive concepts.
Figure 13:
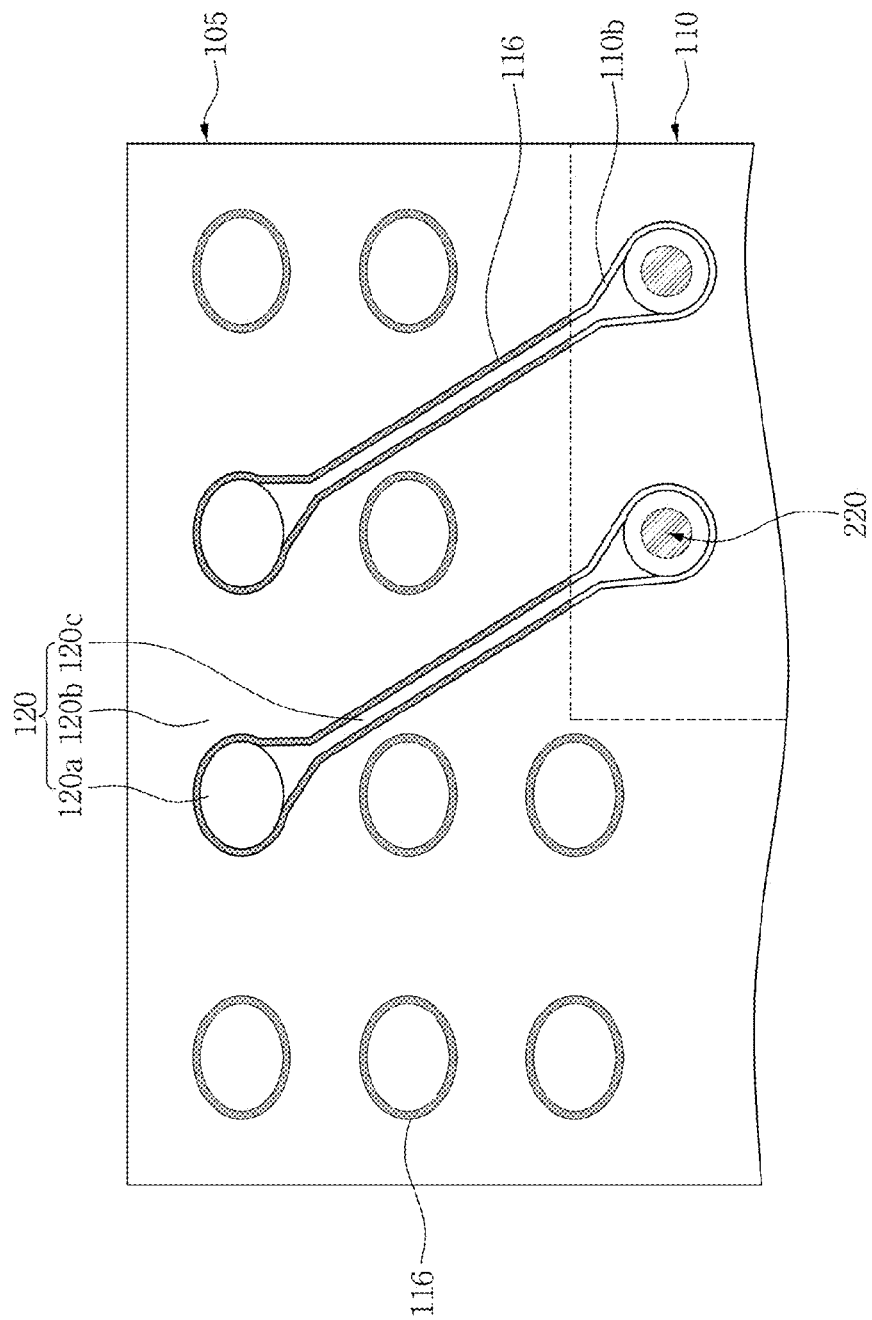
FIG. 13 is a plan view of a portion of a lower package substrate of FIG. 12.

FIG. 12 is a cross-sectional view of a stack-type semiconductor package according to example embodiments of inventive concepts. FIG. 13 is a plan view of a portion of a lower package substrate of FIG. 12.

Referring to FIGS. 12 and 13, the stack-type semiconductor package 500*g* according to example embodiments of inventive concepts may include a lower semiconductor package 100*g* and an upper semiconductor package 200*g*. The lower semiconductor package 100*g* may include a lower package substrate 105 having a top surface 105*a* on which first lower lands 106 are formed, a lower semiconductor chip 110 mounted on a top surface 105*a* of the lower package substrate 105, and a lower encapsulant 116 formed on the top surface 105*a* of the lower package substrate 105 and having via holes 118 exposing the first lower lands 106. The upper semiconductor package 200*g* may be disposed on the lower encapsulant 116 and have upper solder balls 220 formed on a bottom surface 205*b* of an upper package substrate 205.

The stack-type semiconductor package 500*g* may include connection pads 120*a* formed on the via holes 118 and the lower encapsulant 116 and configured to electrically connect the lower semiconductor package 100*g* and the upper semiconductor package 200*g*, a metal layer pattern 120*b* formed on the entire surface of the lower package substrate 105 and isolated from the connection pads 120*a*, and redistribution patterns 120*c* configured to electrically connect the upper solder balls 220 and the connection pads 120*a*.

The connection pads 120*a*, the metal layer pattern 120*b*, and the redistribution patterns 120*c* may be formed in the same metal layer 120.

As shown in FIG. 13, each of the redistribution patterns 120*c* may be connected to the connection pad 120*a* and electrically extend the connection pad 120*a* along the redistribution pattern 120*c*.

The redistribution patterns 120 may be formed on a top surface 110*b* of the lower semiconductor chip 110. In this case, since the upper solder balls 220 may be disposed over the lower semiconductor chip 110, the upper solder balls 220 may be widely disposed on the bottom surface 205*b* of the upper package substrate 205.

Figure 14:
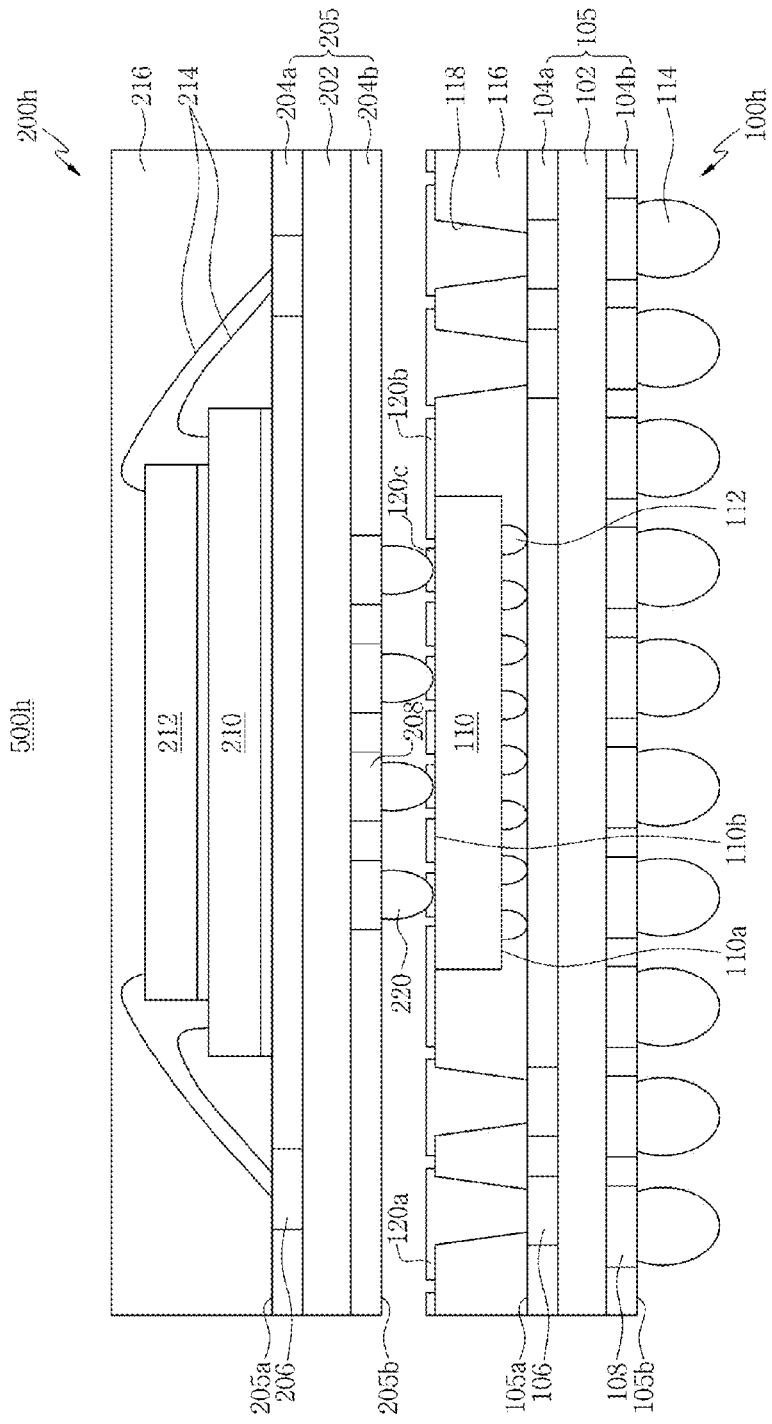
FIG. 14 is a cross-sectional view of a stack-type semiconductor package according to example embodiments of inventive concepts.

FIG. 14 is a cross-sectional view of a stack-type semiconductor package 500*h* according to example embodiments of inventive concepts.

Referring to FIG. 14, the stack-type semiconductor package 500*h* according to example embodiments of inventive concepts may have the same structure and effects as the stack-type semiconductor package 500*g* shown in FIG. 12 except that connection pads 120*a* are formed to fill via holes 118.

Hereinafter, a method of fabricating a stack-type semiconductor package according to example embodiments of inventive concepts will be described with reference to FIGS. 15A through 26.

FIGS. 15A through 19B are cross-sectional views and plan views illustrating a method of fabricating a stack-type semiconductor package according to example embodiments of inventive concepts. FIGS. 15B, 16B, 17B, 18B, and 19B are plan views of a portion of a lower package substrate.

Figure 15A:
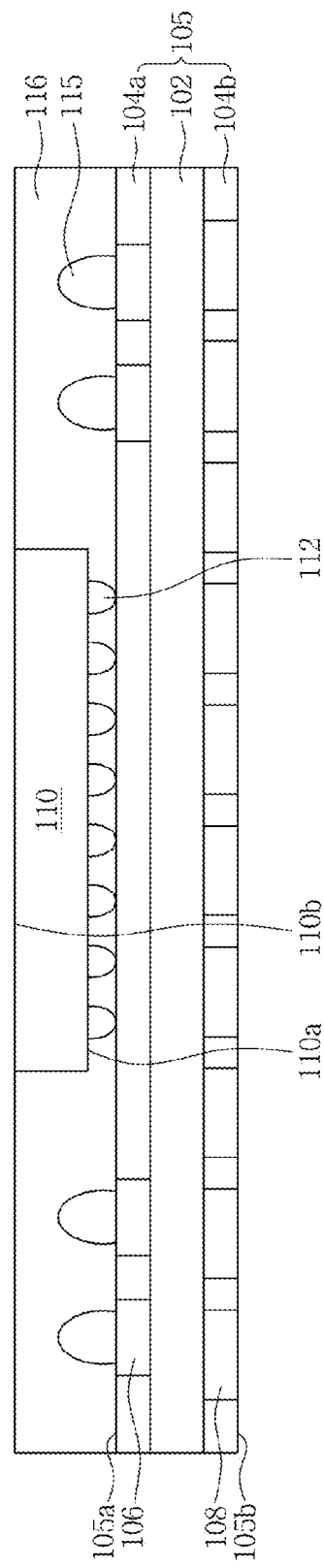
FIGS. 15A through 19B are cross-sectional views and plan views illustrating a method of fabricating a stack-type semiconductor package according to example embodiments of inventive concepts.
Figure 15B:
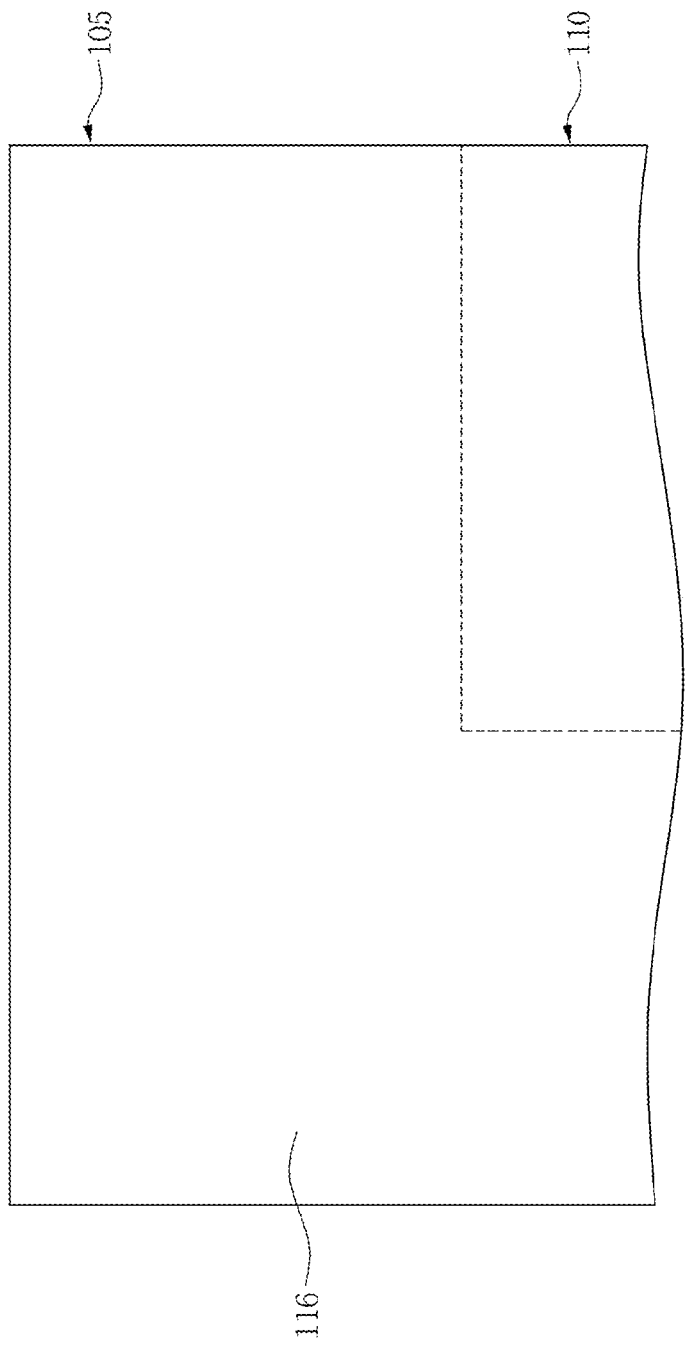

Referring to FIGS. 15A and 15B, a lower package substrate 105 including a lower core layer 102, lower solder resist layers 104*a* and 104*b*, and first and second lower lands 106 and 108 may be prepared.

The lower package substrate 105 may be a substrate including a plurality of lower lines, which may include a rigid PCB, a flexible PCB, or a rigid-flexible PCB. The plurality of lower lines may be formed in the lower core layer 102 constituting the lower package substrate 105.

The first lower lands 106 formed on a top surface 105*a* of the lower package substrate 105 may be electrically insulated from one another by the first lower solder resist layer 104*a*. The second lower lands 108 formed on a bottom surface 105*b* of the lower package substrate 105 may be electrically insulated from one another by the second lower solder resist layer 104*b*. The first lower lands 106 may be electrically connected to the second lower lands 108 by the lower lines. The first and second lower lands 106 and 108 may include copper, nickel, gold, or a solder material.

A lower semiconductor chip 110 may be mounted on the lower package substrate 105 using a flip-chip technique. For example, the lower semiconductor chip 110 may be disposed such that an active surface 110*a* having chip pads faces a top surface 105*a* of the lower package substrate 105. Thereafter, the lower semiconductor chip 110 may be directly connected onto the lower package substrate 105 using chip bumps 112 adhered to the chip pads. The chip pads formed on the active surface 110*a* of the lower semiconductor chip 110 may be electrically connected to the first lower lands 106 of the first lower package substrate 100 by the chip bumps 112 and the plurality of lower lines.

The lower semiconductor chip 110 may include a logic semiconductor device, such as an MP, an MC, or an AP. The lower semiconductor chip 110 may be an SOC in which different kinds of semiconductor devices are included in one semiconductor chip. The chip bump 112 may include gold (Au), silver (Ag), platinum (Pt), aluminum (Al), copper (Cu), or a solder material.

Lower solder balls 115 may be formed on the first lower lands 106 of the lower package substrate 105. The lower solder balls 115 may be formed in the same arrangement as the first lower lands 106. A lower encapsulant 116 may be formed on the lower package substrate 105 having the lower solder balls 115 to expose a top surface 100*b* of the lower semiconductor chip 110. The lower encapsulant 116 may protect electrical connection between the lower semiconductor chip 110 and the lower package substrate 105 and be formed to surround the lower semiconductor chip 110 and the chip bumps 112. Also, the lower encapsulant 116 may reduce stress applied to the top surface 105*a* of the lower package substrate 105. The lower encapsulant 116 may include an epoxy resin or an EMC.

Figure 16A:
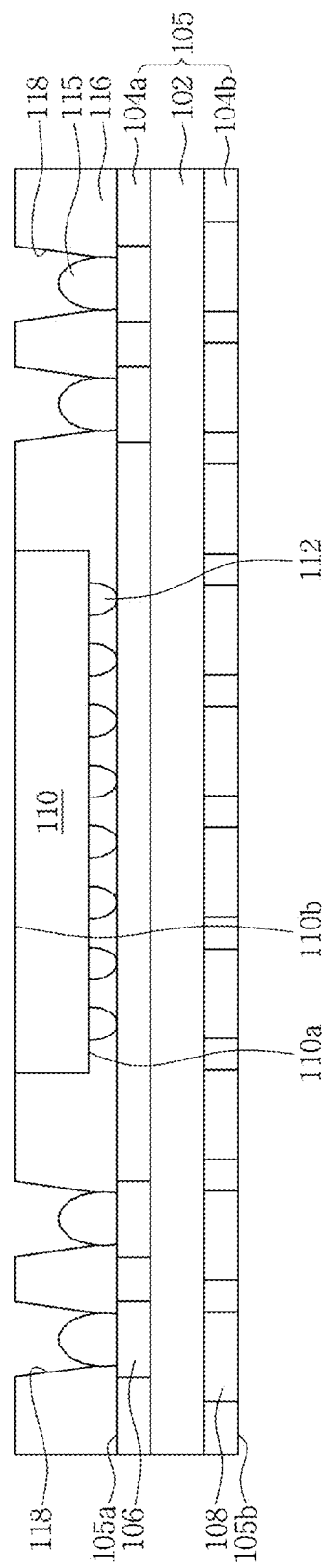

Referring to FIGS. 16A and 16B, the lower encapsulant 116 may be selectively removed using a laser drilling process to form via holes 118 exposing the surfaces of the lower solder balls 115.

The via holes 118 may be formed to expose a top surface and/or side surface of the lower solder ball 115 or a portion of the surface of the first lower solder resist layer 104a. The lower solder ball 115 may be formed at a lower level than a top surface of the via hole 118.

Figure 17A:
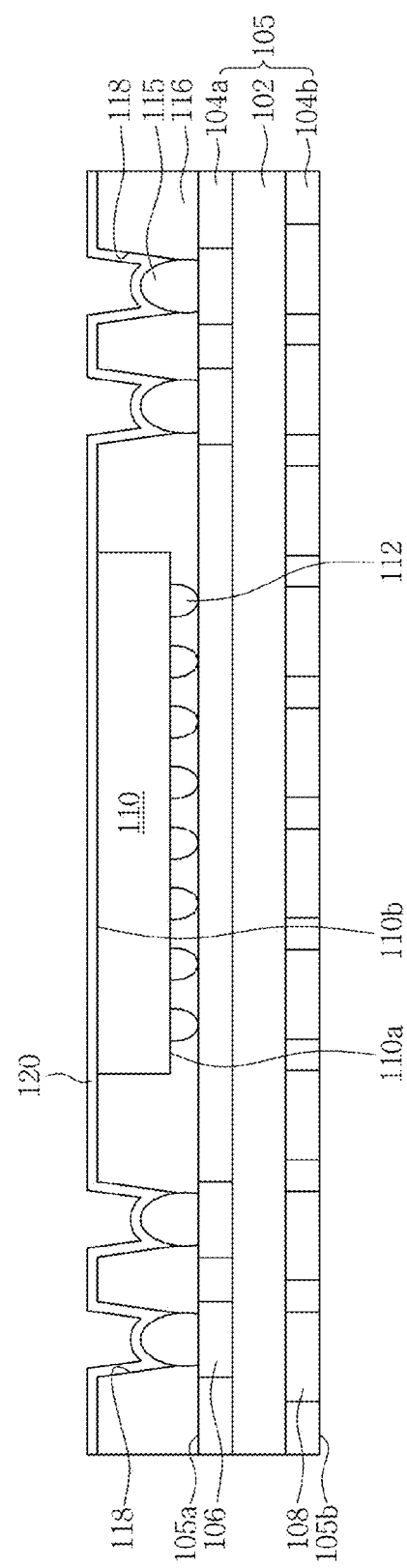

Referring to FIGS. 17A and 17B, a metal layer 120 may be deposited on the entire surface of the lower package substrate 105 having the via holes 118 using, for example, a sputtering process. The metal layer 120 may include copper, nickel, aluminum, gold, silver, or an alloy thereof. The metal layer 120 may be conformally formed on both sidewalls of the via holes 118, exposed surfaces of the lower solder balls 115, and the lower encapsulant 116.

Figure 18A:
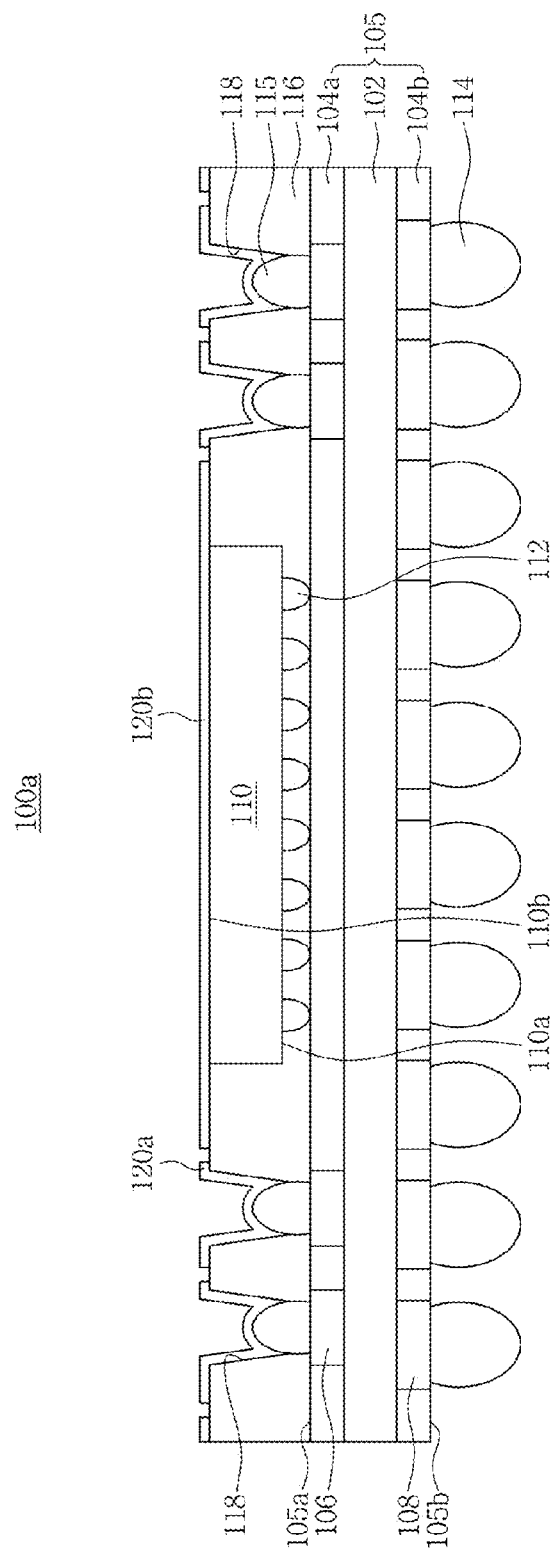

Referring to FIGS. 18A and 18B, the metal layer 120 may be patterned using a laser cutting technique. As a result, connection pads 120a may be formed on the via holes 118 and the lower encapsulant 116, and a metal layer pattern 120b may be formed on the entire surface of the lower package substrate 105 and isolated from the connection pads 120a.

Each of the connection pads 120a may be electrically connected to the lower solder ball 115 through the via hole 118. The metal layer pattern 120b may function as both a heat sink and an EMI shield layer.

A backend process may be performed on the lower package substrate 105 having the connection pads 120a and the metal layer pattern 120b. The backend process may include a process of cutting the lower package substrate 105 into respective unit semiconductor chips and a process of forming the external connection members 114 on a bottom surface 105b of the lower package substrate 105. The external connection members 114 may be formed in the same arrangement as the second lower lands 108. The external connection members 114 may include a solder material, such as solder balls, solder bumps, or a solder paste, or a spherical metal, a mesa-shaped metal, or a pin-shaped metal. The external connection members 114 may be arranged as a grid type to embody a BGA package.

Thus, the lower semiconductor package 100a including the lower package substrate 105, the lower semiconductor chip 110, the lower solder balls 115, the lower encapsulant 116, the connection pads 120a, the metal layer pattern 120b, and the external connection members 114 may be completed. Since the lower semiconductor package 100a is formed using a laser drilling process, the lower semiconductor package 100a may be referred to as a laser drill package (LDP).

Figure 19A:
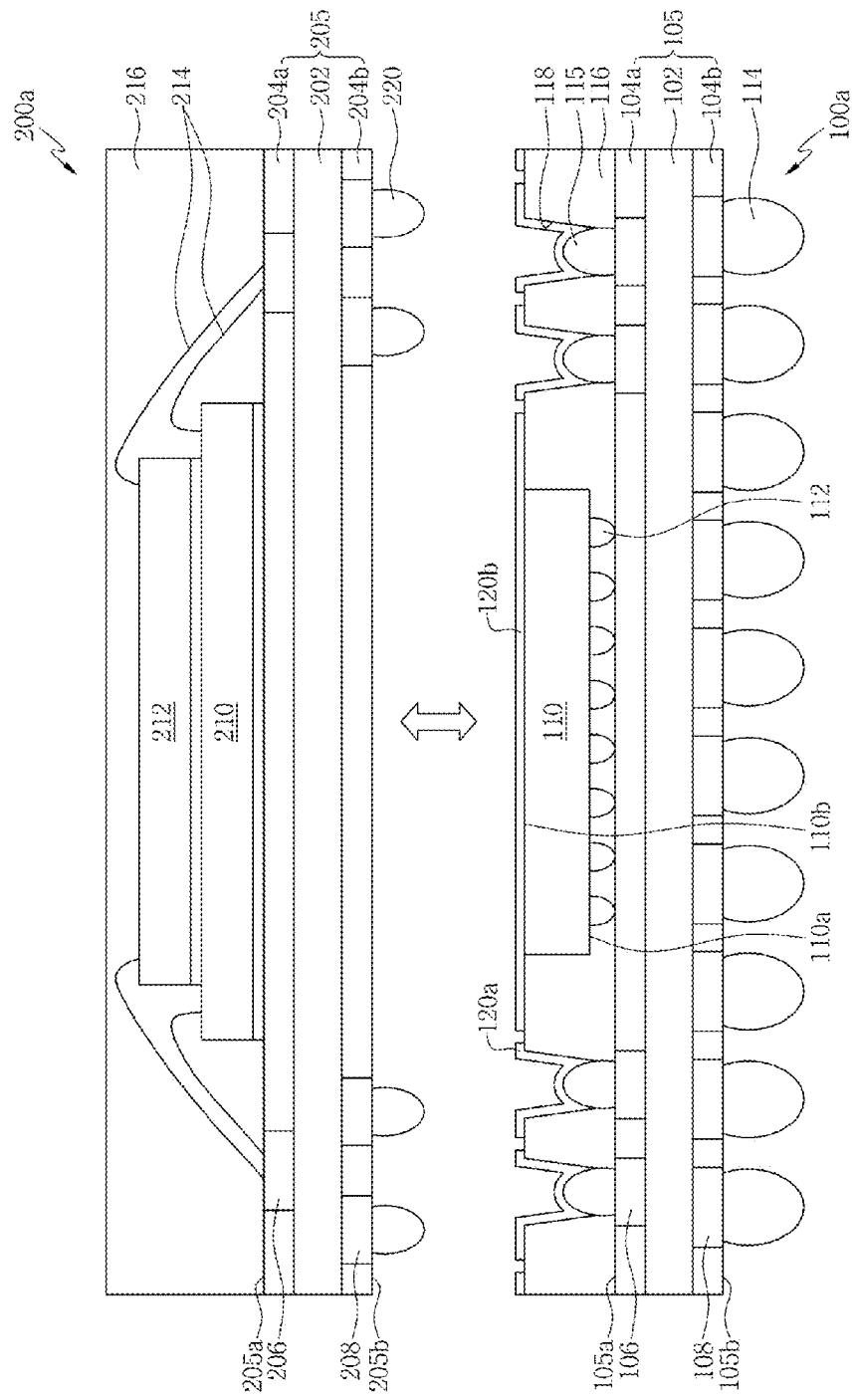

Referring to FIGS. 19A and 19B, an upper semiconductor package 200a may be prepared.

The upper semiconductor package 200a may include an upper package substrate 205, which may have an upper core layer 202, an upper solder resist layers 204a and 204b, and first and second upper lands 206 and 208.

A plurality of upper semiconductor chips 210 and 212 may be mounted on a top surface 205a of the upper package substrate 205 by interposing an adhesive layer, such as a die-attach film (DAF) therebetween. Each of the upper semiconductor chips 210 and 212 may include a memory device. The upper semiconductor chips 210 and 212 may be electrically connected to first upper lands 206 of the upper package substrate 205 by wires 214. The wires 214 may include gold, silver, platinum, aluminum, copper, nickel, cobalt, chromium, or titanium.

An upper encapsulant 216 may be formed on the upper package substrate 205 to protect active surfaces of the upper semiconductor chips 210 and 212 and the wires 214. The upper encapsulant 216 may include an epoxy resin or an EMC. Upper solder balls 220 may be formed on the second upper lands 208 disposed on a bottom surface 205b of the upper package substrate 205. The upper solder balls 220 may be laterally spaced apart from the lower solder balls 115 of the lower semiconductor package 100a by a desired (and/or alternative predetermined) distance in consideration of solder reflow during a subsequent solder joint process.

The upper semiconductor package 200a may be vertically stacked on the lower semiconductor package 100a, and a solder joint process may be performed to bond the upper solder balls 220 of the upper semiconductor package 200a with the connection pads 120a of the lower semiconductor package 100a. By connecting the upper solder balls 220 with the connection pads 120a using the solder joint process, the upper semiconductor package 200a may be electrically connected to the lower semiconductor package 100a.

As shown in FIG. 19B, each of the connection pads 120a may be connected to the lower solder balls 115 through the via hole 118, and be connected to the upper solder ball 220 on the lower encapsulant 116. Thus, each of the connection pads 120a may serve as an electrical path between the lower semiconductor package 100a and the upper semiconductor package 200a.

Hereinafter, a method of fabricating a stack-type semiconductor package according to example embodiments of inventive concepts will be described. Here, the same descriptions as in the previous embodiments will be omitted, and only modifications will chiefly be described.

Figure 20A:
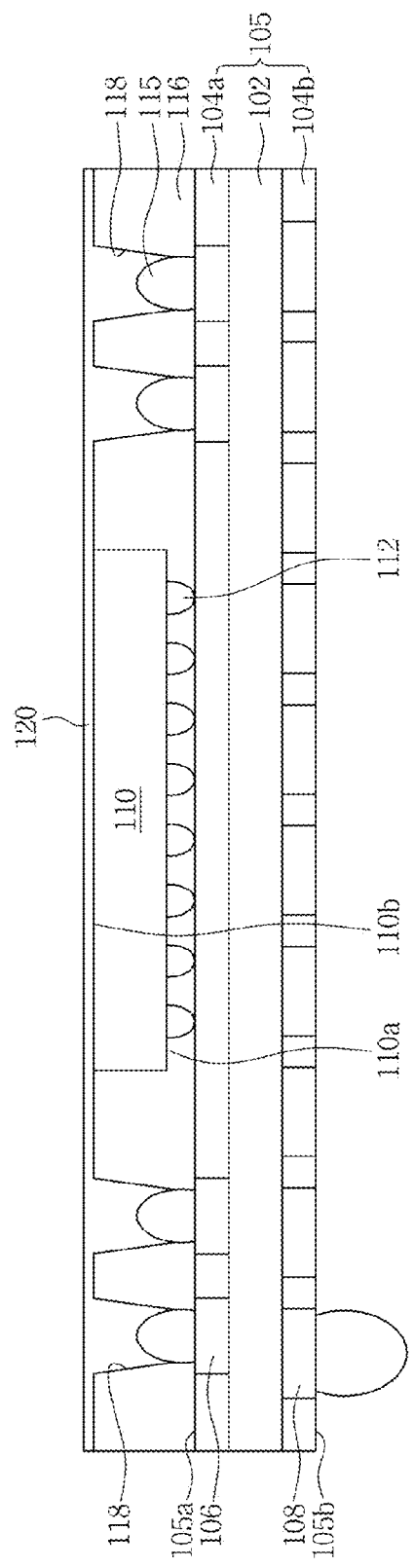
FIGS. 20A and 20B are cross-sectional views illustrating a method of fabricating a stack-type semiconductor package according to example embodiments of inventive concepts.
Figure 20B:
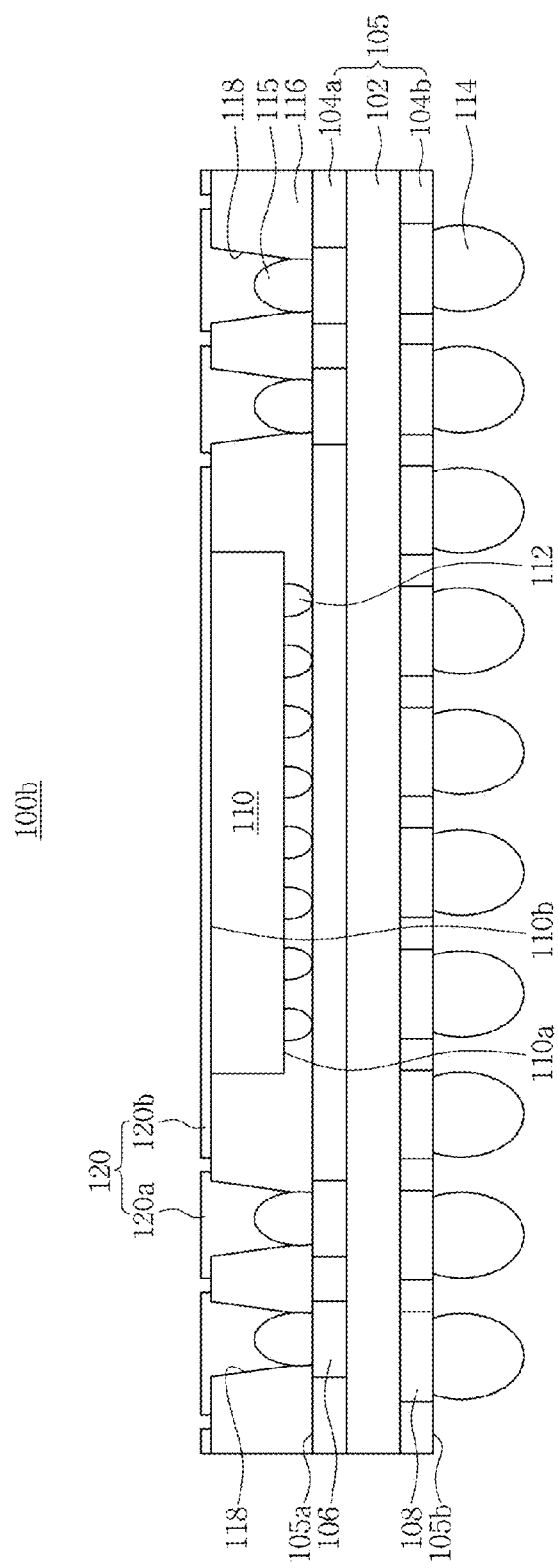

FIGS. 20A and 20B are cross-sectional views illustrating a method of fabricating a stack-type semiconductor package according to example embodiments of inventive concepts.

Referring to FIG. 20A, the processes described with reference to FIGS. 15A and 16A may be performed on a lower package substrate 105 to form a lower semiconductor chip 110, lower solder balls 115, a lower encapsulant 116, and via holes 118 through the lower encapsulant 116 to expose the surfaces of the lower solder balls 115.

A metal layer 120 may be deposited on the entire surface of the lower package substrate 105 using, for example, a sputtering process. The metal layer 120 may be formed on the lower encapsulant 116 to a desired (and/or alternative predetermined) thickness to fill the via holes 118.

Referring to FIG. 20B, the metal layer 120 may be patterned using a laser cutting technique to form connection pads 120a and a metal layer pattern 120b.

The connection pads 120a may be formed on the via holes 118 and the lower encapsulant 116 and connected to the lower solder balls 115 through the via holes 118. The metal layer pattern 120b may be formed on the entire surface of the lower package substrate 105 and isolated from the connection pads 120a. The metal layer pattern 120b may function as both a heat sink and an EMI shield layer.

External connection members 114 may be formed on a bottom surface 105b of the lower package substrate 105 having the connection pads 120a and the metal layer pattern 120b to complete a lower semiconductor package 100b. Thereafter, the processes described with reference to FIG. 19A may be performed. Thus, an upper semiconductor package 200b may be vertically stacked on the lower semiconductor package 100b, and the upper solder balls 220 of the upper semiconductor package 200b may be bonded to the connection pads 120a to electrically connect the lower semiconductor package 100b with the upper semiconductor package 200b.

Figure 21:
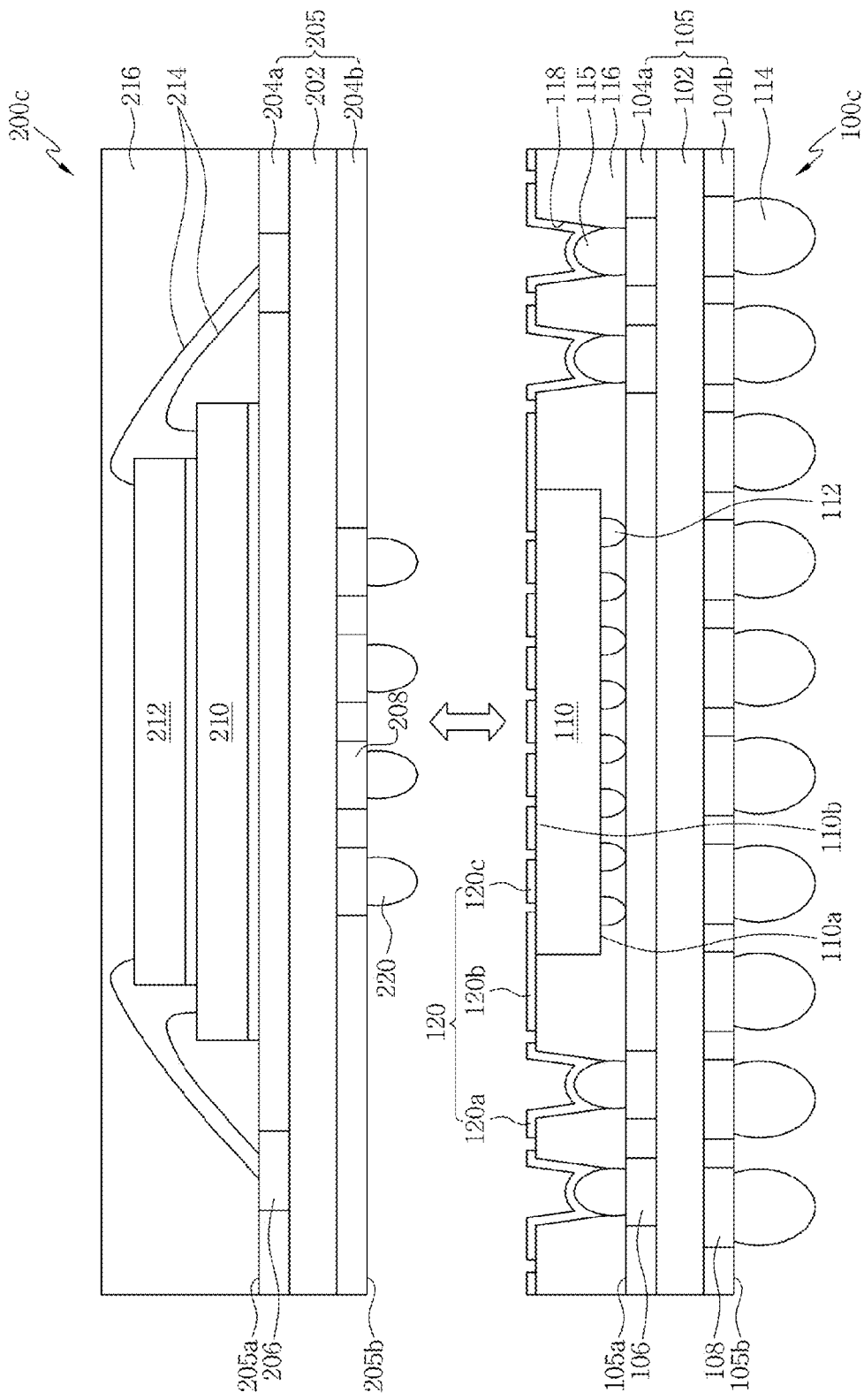
FIG. 21 is a cross-sectional view illustrating a method of fabricating a stack-type semiconductor package according to example embodiments of inventive concepts.

FIG. 21 is a cross-sectional view illustrating a method of fabricating a stack-type semiconductor package according to example embodiments of inventive concepts.

Referring to FIG. 21, the processes described with reference to FIGS. 15A through 17A may be performed. Thus, a lower semiconductor chip 110, lower solder balls 115, a lower encapsulant 116, via holes 118, and a metal layer 120 may be formed on a lower package substrate 105.

The metal layer 120 may be conformally formed on both sidewalls of the via holes 118, exposed surfaces of the lower solder balls 115, and the lower encapsulant 116.

The metal layer 120 may be patterned using a laser cutting technique to form connection pads 120a, a metal layer pattern 120b, and redistribution patterns 120c. The connection pads 120a may be connected to the lower solder balls 115 through the via holes 118. The metal layer pattern 120b may be isolated from the connection pads 120a. Also, the redistribution patterns 120c may be connected to the connection pads 120a.

Each of the connection pads 120a may electrically extend along the corresponding redistribution pattern 120c. The redistribution patterns 120c may be formed on the top surface 110b of the lower semiconductor chip 110.

External connection members 114 may be formed on a bottom surface of the lower package substrate 105 to complete a lower semiconductor package 100c. Thereafter, the processes described with reference to FIG. 19A may be performed. Thus, an upper semiconductor package 200c having upper solder balls 220 disposed over the lower semiconductor chip 110 may be vertically stacked on the lower semiconductor package 100c. A solder joint process may be performed to bond the upper solder balls 220 onto the redistribution patterns 120c so that the upper solder balls 220 can be electrically connected to connection pads 120a by the redistribution patterns 120c. By electrically connecting the upper solder balls 220 to the lower solder balls 115 using the connection pads 120a, the lower semiconductor package 100c may be electrically connected to the upper semiconductor package 200c.

Figure 22:
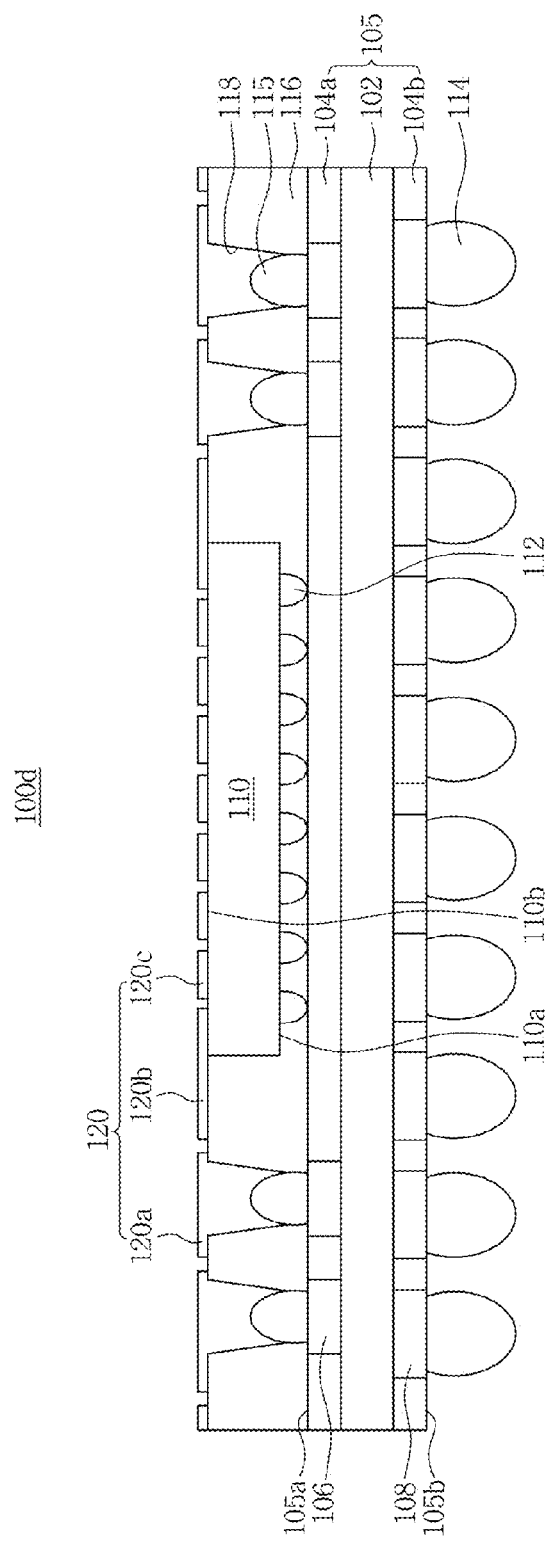
FIG. 22 is a cross-sectional view illustrating a method of fabricating a stack-type semiconductor package according to example embodiments of inventive concepts.

FIG. 22 is a cross-sectional view illustrating a method of fabricating a stack-type semiconductor package according to example embodiments of inventive concepts.

Referring to FIG. 22, the processes described with reference to FIGS. 15A through 17A may be performed, thereby forming a lower semiconductor chip 110, lower solder balls 115, a lower encapsulant 116, via holes 118, and a metal layer 120 on a lower package substrate 105.

The metal layer 120 may be formed to a desired (and/or alternative predetermined) thickness on the lower encapsulant 116 to fill the via holes 118.

The metal layer 120 may be patterned using a laser cutting technique to form connection pads 120a, a metal layer pattern 120b, and redistribution patterns 120c. The connection pads 120a may be connected to the lower solder balls 115 through the via holes 118. The metal layer pattern 120b may be isolated from the connection pads 120a. The redistribution patterns 120c may be connected to the connection pad 120a. The metal layer pattern 120b may be formed on the entire surface of the lower package substrate 105, and the redistribution patterns 120c may be formed on a top surface 110b of the lower semiconductor chip 110.

External connection members 114 may be formed on a bottom surface 105b of the lower package substrate 105 to complete a lower semiconductor package 100d. Thereafter, the processes described with reference to FIG. 19A may be performed. Thus, an upper semiconductor package (refer to 200d in FIG. 8) having upper solder balls 220 disposed over the lower semiconductor chip 110 may be vertically stacked on the lower semiconductor package 100d. Afterwards, the upper solder balls 220 may be bonded onto the redistribution patterns 120c so that the lower semiconductor package 100d can be electrically connected to the upper semiconductor package 200d.

Figure 23A:
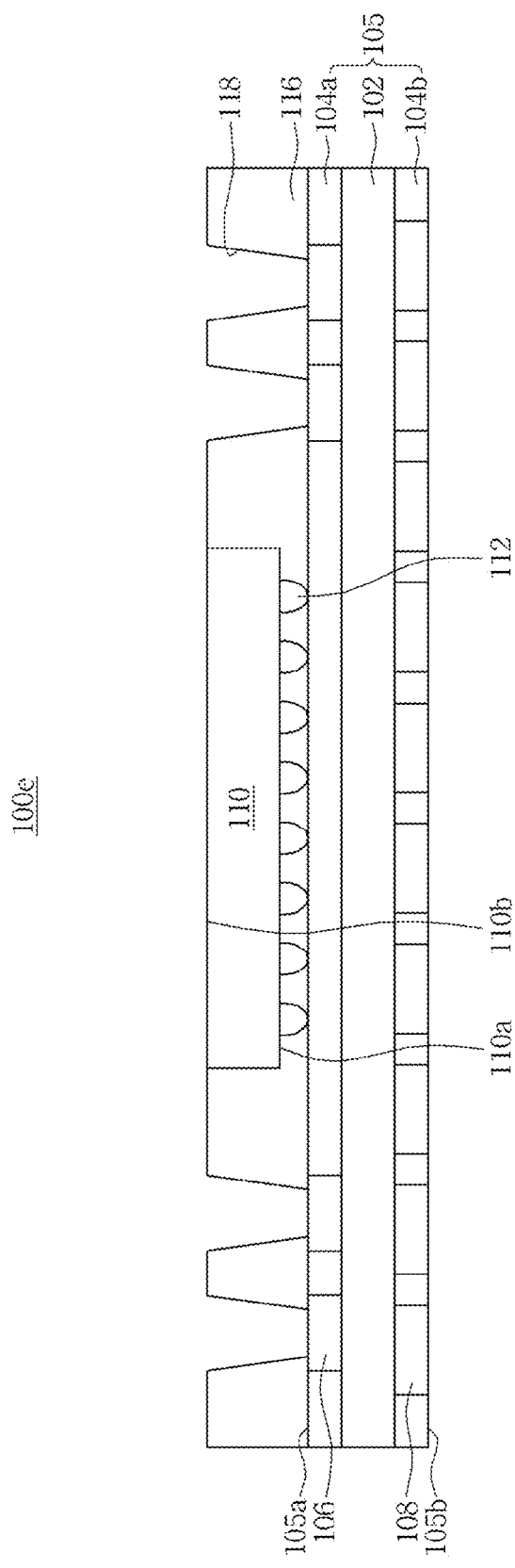
FIGS. 23A through 23C are cross-sectional views illustrating a method of fabricating a stack-type semiconductor package according to example embodiments of inventive concepts.
Figure 23B:
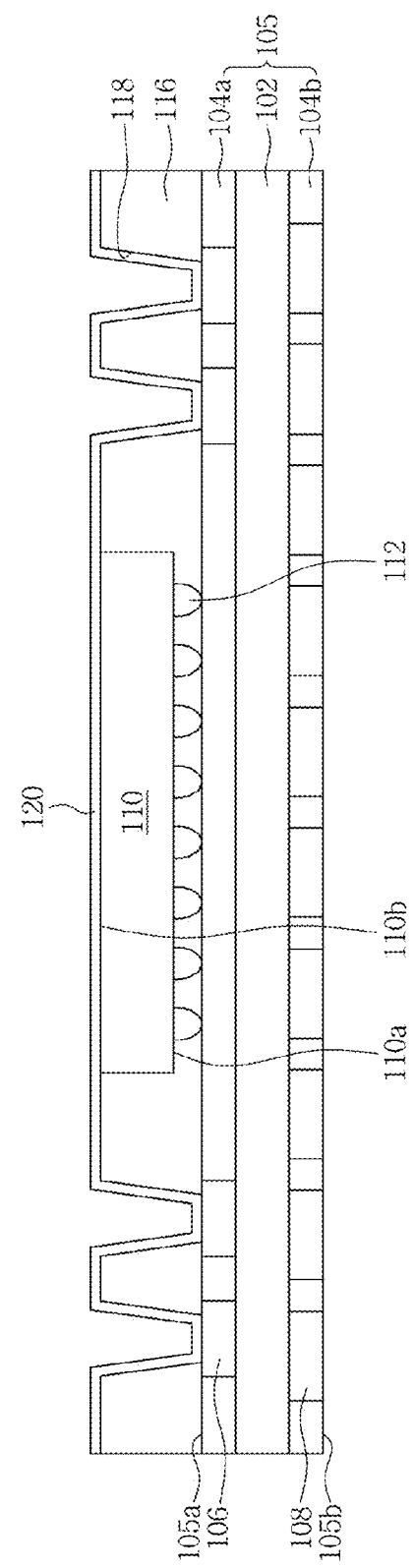
Figure 23C:
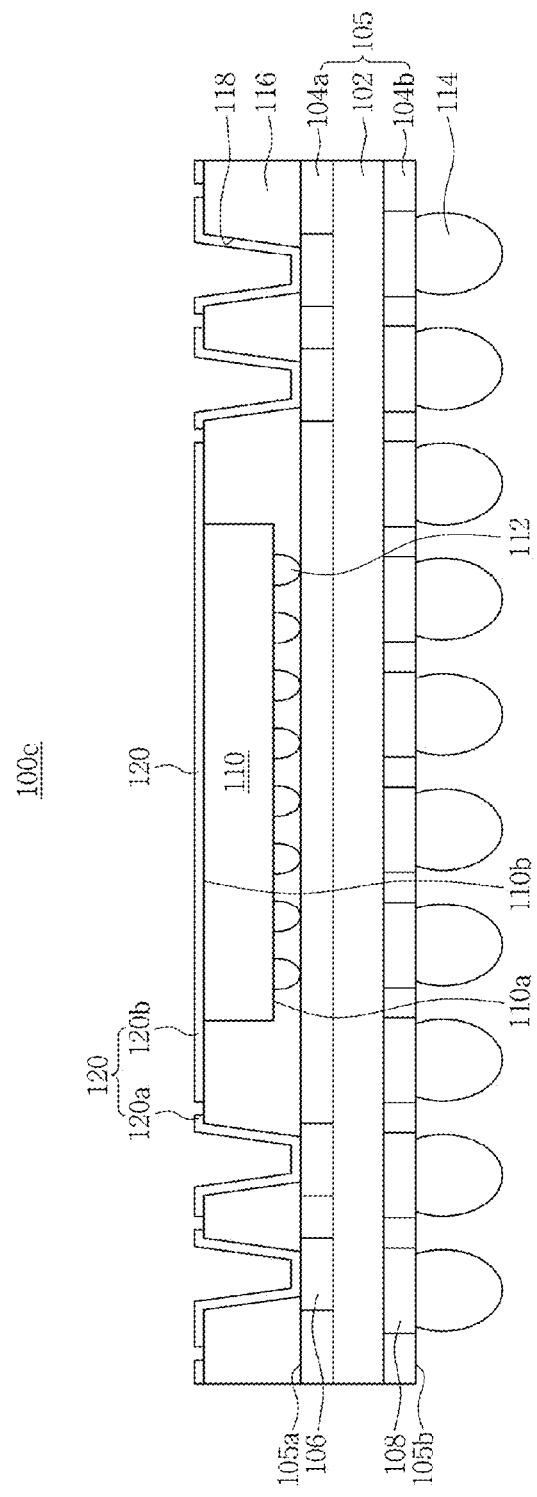

FIGS. 23A through 23C are cross-sectional views illustrating a method of fabricating a stack-type semiconductor package according to example embodiments of inventive concepts.

Referring to FIG. 23A, a lower package substrate 105 including a lower core layer 102, lower solder resist layers 104a and 104b, and first and second lower lands 106 and 108 may be prepared.

The first lower lands 106 formed on a top surface 105a of the lower package substrate 105 may be electrically insulated from one another by the first lower solder resist layer 104a. The second lower lands 108 formed on a bottom surface 105b of the lower package substrate 105 may be electrically insulated from one another by the second lower solder resist layer 104b. The first lower lands 106 may be electrically connected to the second lower lands 108 by the lower lines.

A lower semiconductor chip 110 may be mounted on the lower package substrate 105 using a flip-chip technique. Chip pads formed on an active surface 110a of the lower semiconductor chip 110 may be electrically connected to the first lower lands 106 of the first lower package substrate 100 by chip bumps 112 and a plurality of lower lines.

A lower encapsulant 116 may be formed on the lower package substrate 105 on which the lower semiconductor chip 110 is mounted, to expose a top surface 110b of the lower semiconductor chip 110. Thereafter, the lower encapsulant 116 may be selectively removed using a laser drilling process to form via holes 118 exposing portions of the surfaces of the first lower lands 106.

Referring to FIG. 23B, a metal layer 120 may be deposited using, for example, a sputtering process on the entire surface of the lower package substrate 105 having the via holes 118. The metal layer 120 may be conformally formed on both sidewalls of the via holes 118, exposed surfaces of the first lower lands 106, and the lower encapsulant 116.

Referring to FIG. 23C, the metal layer 120 may be patterned using a laser cutting technique to form connection pads 120a and a metal layer pattern 120b.

The connection pads 120a may be formed on the via holes 118 and the lower encapsulant 116, and be connected to the first lower lands 106 through the via holes 118. The metal layer pattern 120b may be formed on the entire surface of the lower package substrate 105 and isolated from the connection pads 120a.

External connection members 114 may be formed on the bottom surface 105b of the lower package substrate 105 to complete a lower semiconductor package 100e.

Thereafter, the processes described with reference to FIG. 19A may be performed. Thus, an upper semiconductor package (refer to 200e in FIG. 9) may be vertically stacked on the lower semiconductor package 100e. Thereafter, upper solder balls 220 of the upper semiconductor package 200e may be bonded to the connection pads 120a using a solder joint process so that the lower semiconductor package 100e can be electrically connected to the upper semiconductor package 200e.

The connection pads 120a may be connected to first lower lands 106 of the lower semiconductor package 100e through the via holes 115, and be connected to the upper solder balls 220 of the upper semiconductor package 200e on the lower encapsulant 116. Thus, each of the connection pads 120a may serve as an electrical path between the lower semiconductor package 100e and the upper semiconductor package 200e.

Figure 24A:
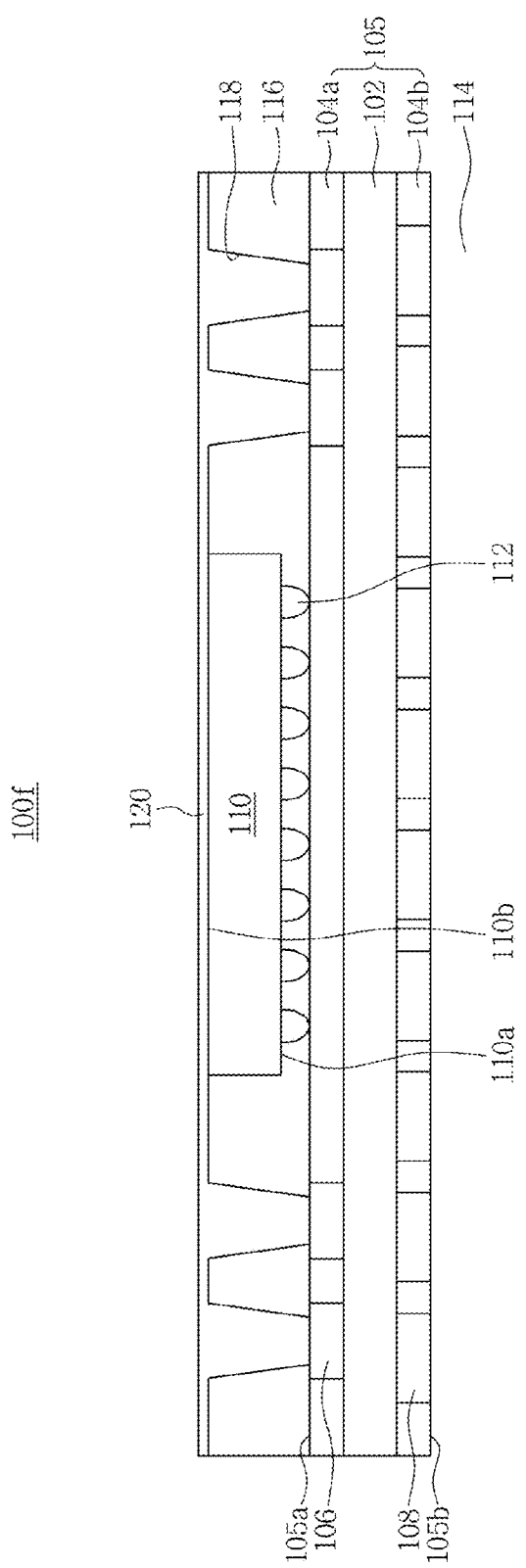
FIGS. 24A and 24B are cross-sectional views illustrating a method of fabricating a stack-type semiconductor package according to example embodiments of inventive concepts.
Figure 24B:
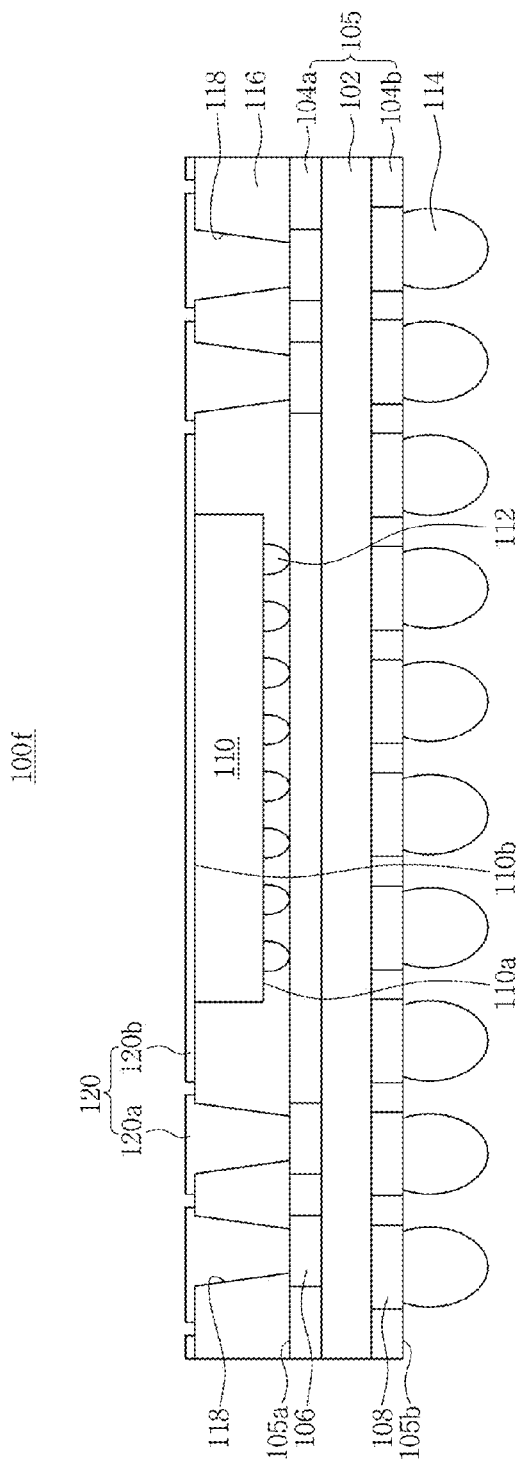

FIGS. 24A and 24B are cross-sectional views illustrating a method of fabricating a stack-type semiconductor package according to example embodiments of inventive concepts.

Referring to FIG. 24A, the processes described with reference to FIG. 23A may be performed. Thus, a lower semiconductor chip 110 and a lower encapsulant 116 may be formed on a lower package substrate 105 having a top surface 105a on which first lower lands 106 are formed. Via holes 118 may be formed through the lower encapsulant 116 to expose the first lower lands 106.

A metal layer 120 may be deposited using, for example, a sputtering process on the entire surface of the lower package substrate 105. The metal layer 120 may be formed to a desired (and/or alternative predetermined) thickness on the lower encapsulant 116 to fill the via holes 118.

Referring to FIG. 24B, the metal layer 120 may be patterned using a laser cutting technique to form connection pads 120a and a metal layer pattern 120b. The connection pads 120a may be connected to the first lower lands 106 through the via holes 118. The metal layer pattern 120b may be isolated from the connection pads 120a.

External connection members 114 may be formed on a bottom surface 105 of the lower package substrate 105 to complete a lower semiconductor package 100f. Thereafter, the processes described with reference to FIG. 19A may be performed. Thus, an upper semiconductor package (refer to 200f in FIG. 11) may be vertically stacked on the lower semiconductor package 100f. Thereafter, the connection pads 120a may be bonded to upper solder balls 220 so that the lower semiconductor package 100f can be electrically connected to the upper semiconductor package 200f.

Figure 25:
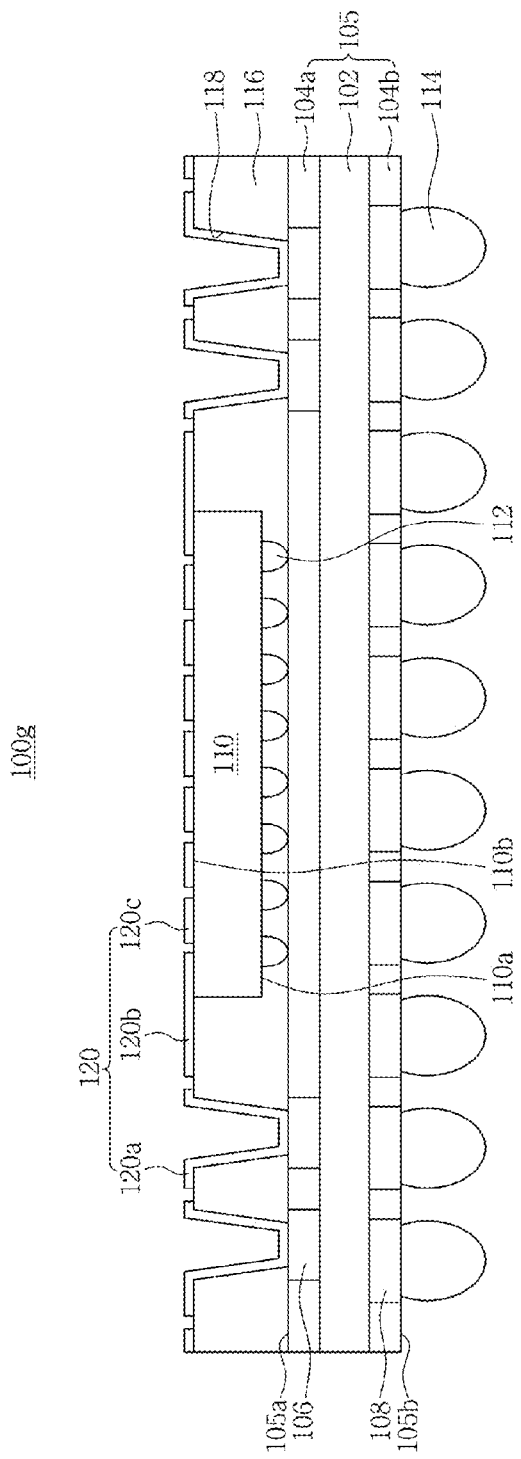
FIG. 25 is a cross-sectional view illustrating a method of fabricating a stack-type semiconductor package according to example embodiments of inventive concepts.

FIG. 25 is a cross-sectional view illustrating a method of fabricating a stack-type semiconductor package according to example embodiments of inventive concepts.

Referring to FIG. 25, the processes described with reference to FIGS. 23A and 23B may be performed. Thus, a lower semiconductor chip 110, a lower encapsulant 116, via holes 118, and a metal layer 120 may be formed on a lower package substrate 105 having a top surface 105a on which first lower lands 106 are formed. The via holes 118 may expose portions of the surfaces of the first lower lands 106.

The metal layer 120 may be conformally formed on both sidewalls of the via holes 118, exposed surfaces of the first lower lands 106, and the lower encapsulant 116.

The metal layer 120 may be patterned using a laser cutting technique, thereby forming connection pads 120a, a metal layer pattern 120b, and redistribution patterns 120c. The connection pads 120a may be formed on the via holes 118 and the lower encapsulant 116, and connected to the first lower lands 106 through the via holes 118. The metal layer pattern 120b may be formed on the entire surface of the lower package substrate 105 and isolated from the connection pads 120a. The redistribution patterns 120c may be connected to the connection pad 120a and formed on a top surface of the lower semiconductor chip 110. Each of the connection pads 120a may electrically extend along the corresponding redistribution pattern 120c.

External connection members 114 may be formed on a bottom surface 105b of the lower package substrate 105 to complete a lower semiconductor package 100g. Thereafter, the processes described with reference to FIG. 19A may be performed. Thus, an upper semiconductor package (refer to 200g in FIG. 12) having upper solder balls 220 disposed over the lower semiconductor chip 110 may be vertically stacked on the lower semiconductor package 100g.

The upper solder balls 220 may be bonded onto the redistribution patterns 120c using a solder joint process so that the upper solder balls 220 can be electrically connected to connection pads 120a by redistribution patterns 120c. The upper solder balls 220 may be electrically connected to the lower solder balls 115 by the connection pads 120a so that the lower semiconductor package 100g can be electrically connected to the upper semiconductor package 200g.

Figure 26:
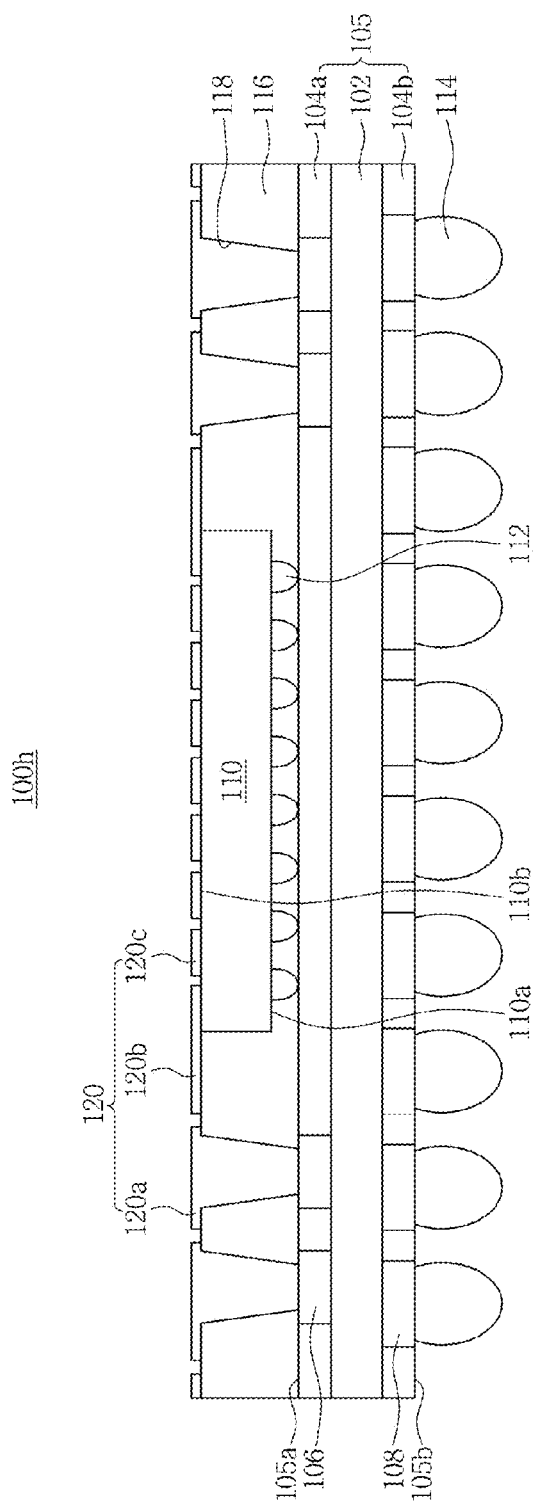
FIG. 26 is a cross-sectional view illustrating a method of fabricating a stack-type semiconductor package according to example embodiments of inventive concepts.

FIG. 26 is a cross-sectional view illustrating a method of fabricating a stack-type semiconductor package according to example embodiments of inventive concepts.

Referring to FIG. 26, the processes described with reference to FIGS. 23A and 23B may be performed. Thus, a lower semiconductor chip 110, a lower encapsulant 116, via holes 118, and a metal layer 120 may be formed on a lower package substrate 105 having a top surface 105a on which first lower lands 106 are formed. The via holes 118 may expose portions of the surfaces of the first lower lands 106.

The metal layer 120 may be formed to a desired (and/or alternative predetermined) thickness on the lower encapsulant 116 to fill the via holes 118.

The metal layer 120 may be patterned using a laser cutting technique to form connection pads 120a, a metal layer pattern 120b, and redistribution patterns 120c. The connection pads 120a may be connected to the first lower lands 106 through the via holes 118. The metal layer pattern 120b may be isolated from the connection pads 120a. The redistribution patterns 120c may electrically extend the connection pads 120a.

External connection members 114 may be formed on a bottom surface 105b of the lower package substrate 105 to complete a lower semiconductor package 100g. Thereafter, the processes described with reference to FIG. 19A may be performed. Thus, an upper semiconductor package (refer to 200h in FIG. 14) having upper solder balls 220 disposed over the lower semiconductor chip 110 may be vertically stacked on the lower semiconductor package 100h. Also, the upper solder balls 220 may be bonded onto the redistribution patterns 120c so that the lower semiconductor package 100h can be electrically connected to the upper semiconductor package 200h by the connection pads 120a and the redistribution patterns 120c.

Figure 27:
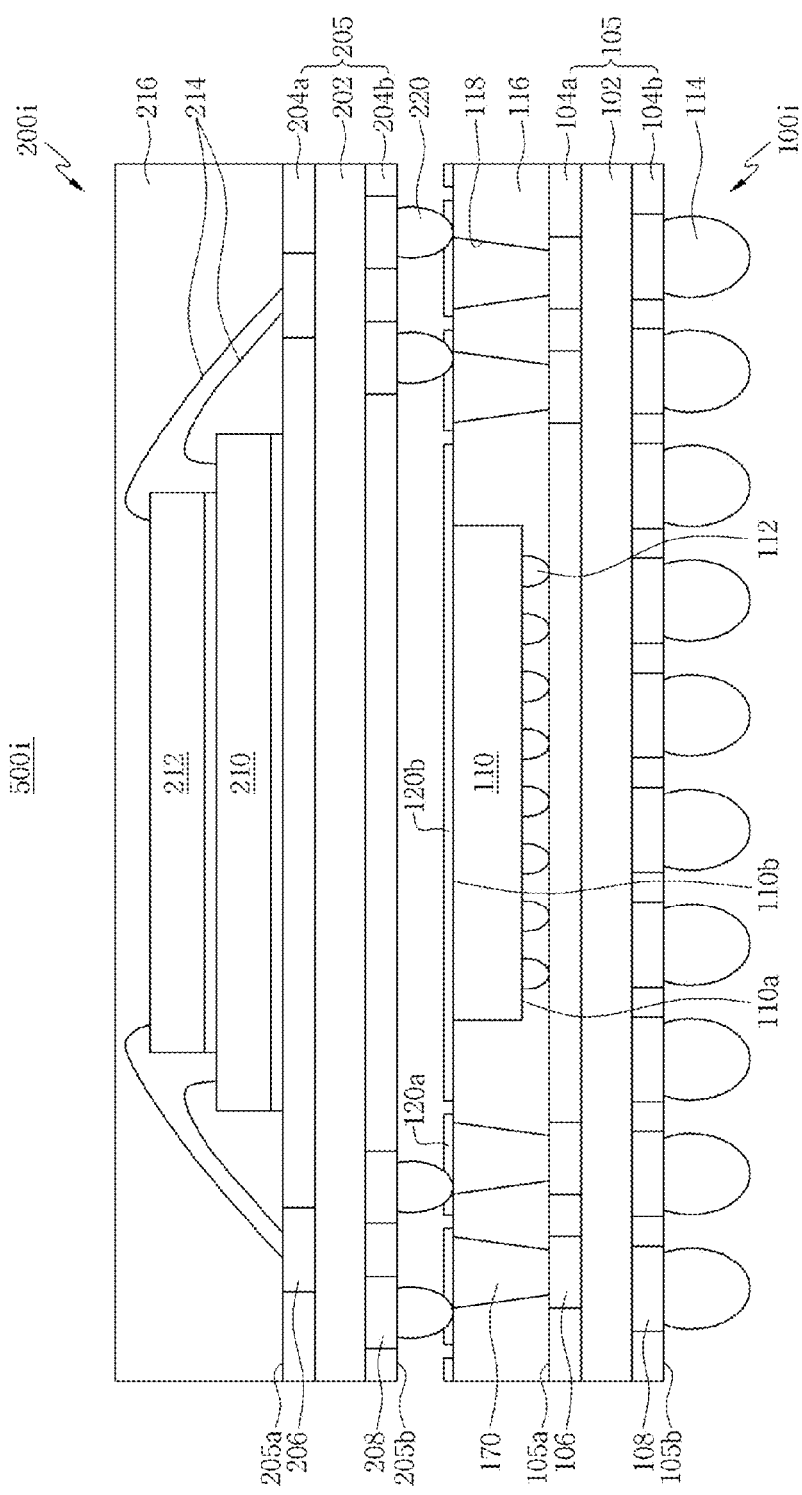
FIG. 27 is a cross-sectional view of a stack-type semiconductor package according to example embodiments of inventive concepts.

FIG. 27 is a cross-sectional view of a stack-type semiconductor package according to example embodiments of inventive concepts.

Referring to FIG. 27, a stack-type semiconductor package 500i according to example embodiments may be the same as the stack-type semiconductor package 500f described previously with reference to FIG. 11, except for the structure of the connection pads 120a. As shown in FIG. 27, the stack-type semiconductor package 500i may include plugs 170 filling the via holes 118. The plugs 170 may include a conductive material such as a metal or metal alloy. The connection pads 120a may be formed on the plugs 170. An upper surface of the plugs 170 may be level with an upper surface of the lower encapsulant 116. A material of the plugs 170 may be different than a material of at least one of the connection pads 120a and the lower lands 106.

Figure 28:
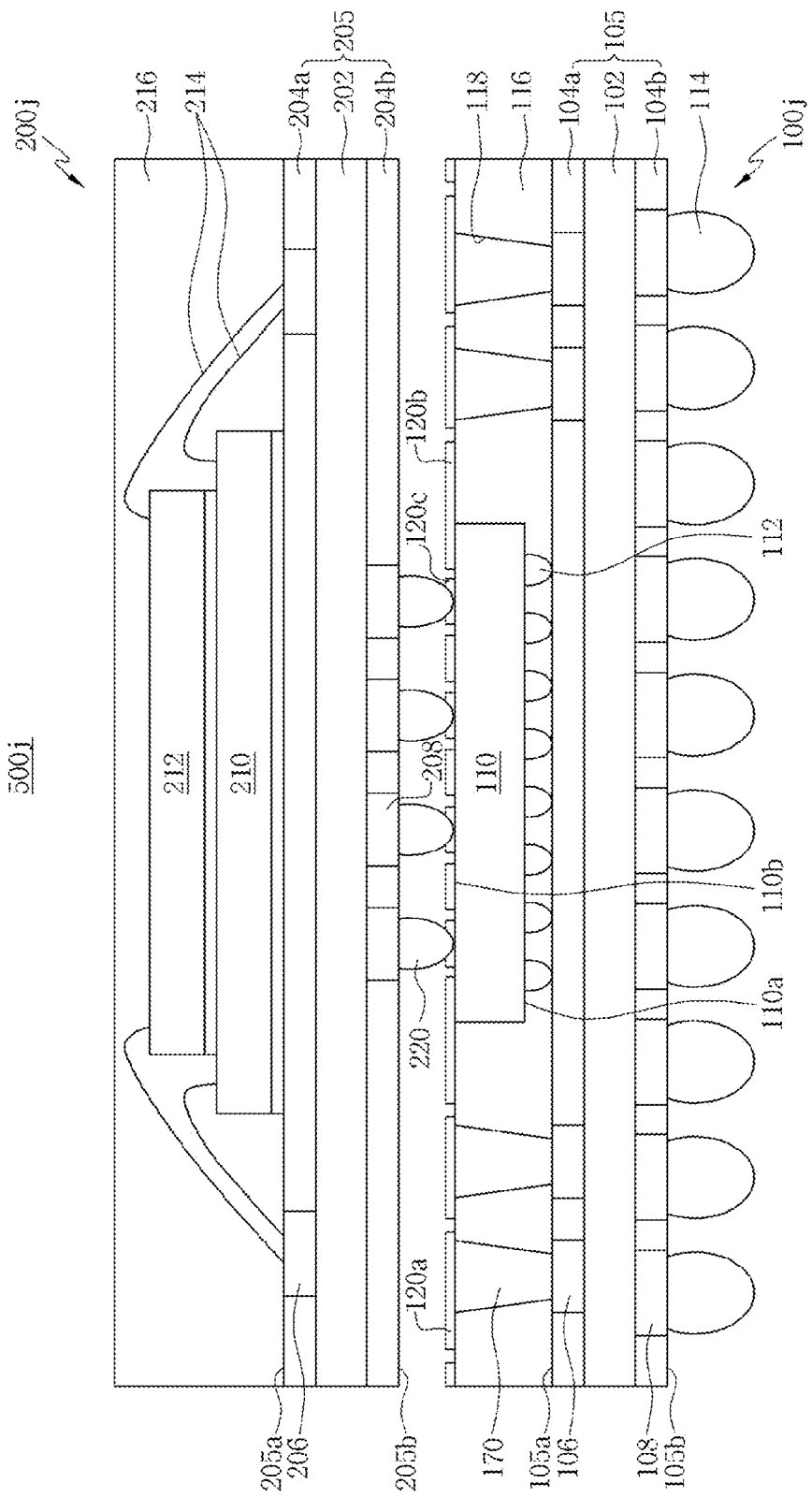
FIG. 28 is a cross-sectional view of a stack-type semiconductor package according to example embodiments of inventive concepts.

FIG. 28 is a cross-sectional view of a stack-type semiconductor package according to example embodiments of inventive concepts.

Referring to FIG. 28, a stack-type semiconductor package 500j according to example embodiments may be the same as the stack-type semiconductor package 500h described previously with reference to FIG. 14, except for the structure of the connection pads 120a. As shown in FIG. 28, the stack-type semiconductor package 500j may include plugs 170 filling the via holes 118. The connection pads 120a may be formed on the plugs 170.

Figure 29:
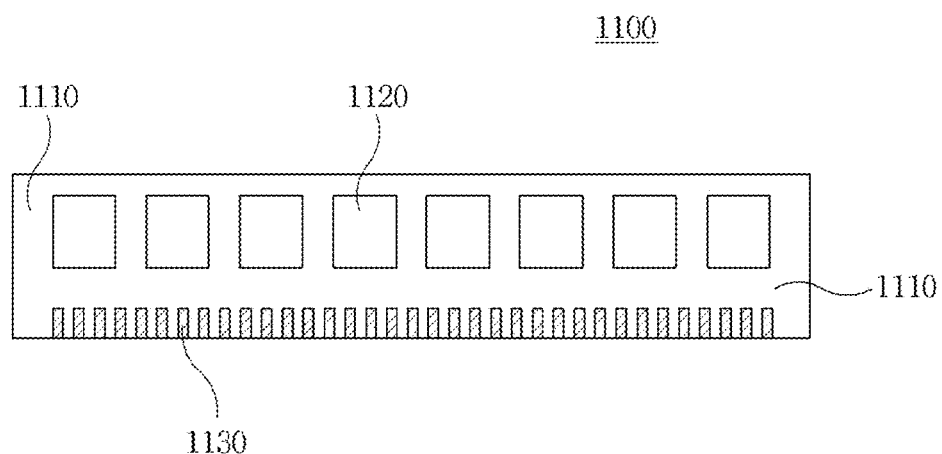
FIG. 29 is a schematic diagram of a semiconductor module having a stack-type semiconductor package according to example embodiments of inventive concepts.

FIG. 29 is a schematic diagram of a semiconductor module including a stack-type semiconductor package according to example embodiments of inventive concepts.

Referring to FIG. 29, a semiconductor module 1100 on which a package stack structure is mounted, according to example embodiments of inventive concepts, may include a module substrate 1110, a plurality of semiconductor devices or stack-type semiconductor packages 1120 disposed on the module substrate 1110, and module contact terminals 1130 formed in a row on one edge of the module substrate 1110 and electrically connected to the semiconductor devices or stack-type semiconductor packages 1120, respectively. The stack-type semiconductor packages 1120 may be one of the above-described stack-type semiconductor packages according to example embodiments, described with reference to FIGS. 1-14 and 27-28.

The module substrate 1110 may be a printed circuit board (PCB). Both surfaces of the module substrate 1110 may be used. In other words, the semiconductor devices or stack-type semiconductor packages 1120 may be disposed on both front and rear surfaces of the module substrate 1110.

The semiconductor module 1100 may further include an additional controller or chipset configured to control the semiconductor devices or stack-type semiconductor packages 1120.

The module contact terminals 1130 may be formed of a metal and have oxidation resistance. The module contact terminals 1130 may be variously set according to standard protocols of the semiconductor module 1110.

Figure 30:
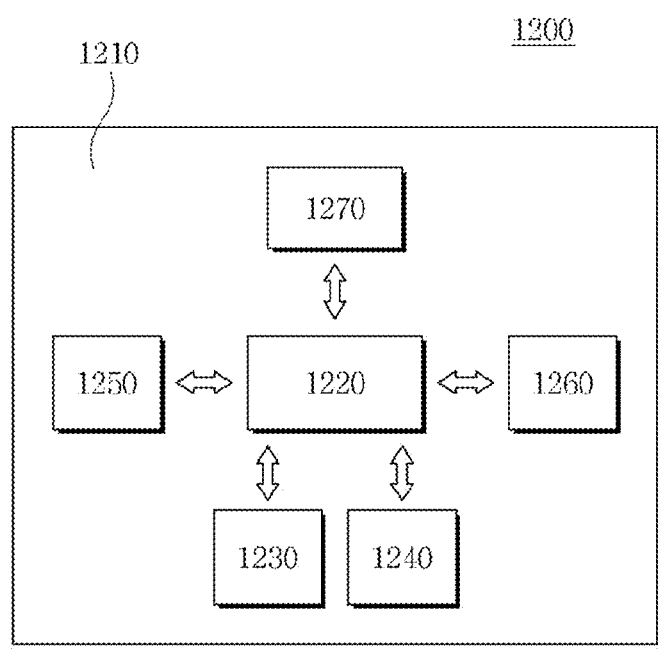
FIG. 30 is a schematic block diagram of an electronic circuit board including a stack-type semiconductor package according to example embodiments of inventive concepts.

FIG. 30 is a schematic block diagram of an electronic circuit board 1200 including a stack-type semiconductor package according to example embodiments of inventive concepts.

Referring to FIG. 30, the electronic circuit board 1200 according to example embodiments of inventive concepts may include a microprocessor (MP) 1220 disposed on a circuit board 1210, a main storage circuit 1230 and a supplementary storage circuit 1240 configured to communicate with the MP 1220, an input signal processing circuit 1250 configured to transmit commands to the MP 1220, an output signal processing circuit 1260 configured to receive commands from the MP 1220, and a communication signal processing circuit 1270 configured to transmit and receive electric signals to and from other circuit boards. In FIG. 30, arrows may be referred to as paths through which signals may be transmitted.

The MP 1220 may receive and process various electric signals, output processing results, and control other components of the electronic circuit board 1200. The MP 1220 may be interpreted as, for example, a central processing unit (CPU) and/or a main control unit (MCU).

The main storage circuit 1230 may temporarily store data always or frequently required by the MP 1220 or data to be processed or already processed data. Since the main storage circuit 1230 needs a high response speed, the main storage circuit 1230 may include a semiconductor memory device. More specifically, the main storage circuit 1230 may be a semiconductor memory device called a cache or include a static random access memory (SRAM), a dynamic RAM (DRAM), a resistive RAM (RRAM), applied semiconductor memory devices thereof (e.g., an utilized RAM, a ferroelectric RAM (FRAM), a fast-cycle RAM, a phase-changeable RAM (PRAM), and a magnetic RAM (MRAM)) and other semiconductor memory devices. The semiconductor device may be included in one of the above-described stack-type semiconductor packages according to example embodiments of inventive concepts, described with reference to FIGS. 1-14 and 27-28. Also, the main storage circuit 1230 may include a volatile or nonvolatile random access memory device. In example embodiments, the main storage circuit 1230 may include a semiconductor module 1100 having stack-type semiconductor packages according to example embodiments of inventive concepts.

The supplementary storage circuit 1240 may be a mass storage device, which may be a nonvolatile semiconductor memory, such as a flash memory, or a hard disc drive (HDD) using a magnetic field. Alternatively, the supplementary storage circuit 1240 may be a compact disc drive (CDD) using light. The supplementary storage circuit 1240 may be used to store a larger amount of data at lower speed as compared with the main storage circuit 1230. The supplementary storage circuit 1240 may include a semiconductor module 1100 having stack-type semiconductor packages according to example embodiments of inventive concepts.

The input signal processing circuit 1250 may change an external command into an electric signal or transmit an external electric signal to the MP 1220. The external command or electric signal may be an operation command, an electric signal to be processed, or data to be stored. The input signal processing circuit 1250 may be a terminal signal processing circuit configured to process signals transmitted from, for example, a keyboard, a mouse, a touch pad, an image recognition apparatus, or various sensors, an image signal processing circuit configured to process an image signal input by a scanner or a camera, various sensors, or an input signal interface. The input signal processing circuit 1250 may include a semiconductor module 1100 having stack-type semiconductor packages according to example embodiments of inventive concepts.

The output signal processing circuit 1260 may be a component configured to externally transmit an electric signal processed by the MP 1220. For instance, the output signal processing circuit 1260 may be a graphic card, an image processor, an optical converter, a beam panel card, or a multifunctional interface circuit. The output signal processing circuit 1260 may include a semiconductor module 1100 having stack-type semiconductor packages according to example embodiments of inventive concepts.

The communication circuit 1270 may be a component configured to directly transmit and receive electric signals to and from another electronic system or another circuit substrate without passing through the input signal processing circuit 1250 or the output signal processing circuit 1260. For example, the communication circuit 1270 may be a modem, a local area network (LAN) card, or various interface circuits of a personal computer (PC) system. The communication circuit 1270 may include a semiconductor module 1100 having stack-type semiconductor packages according to example embodiments of inventive concepts.

Figure 31:
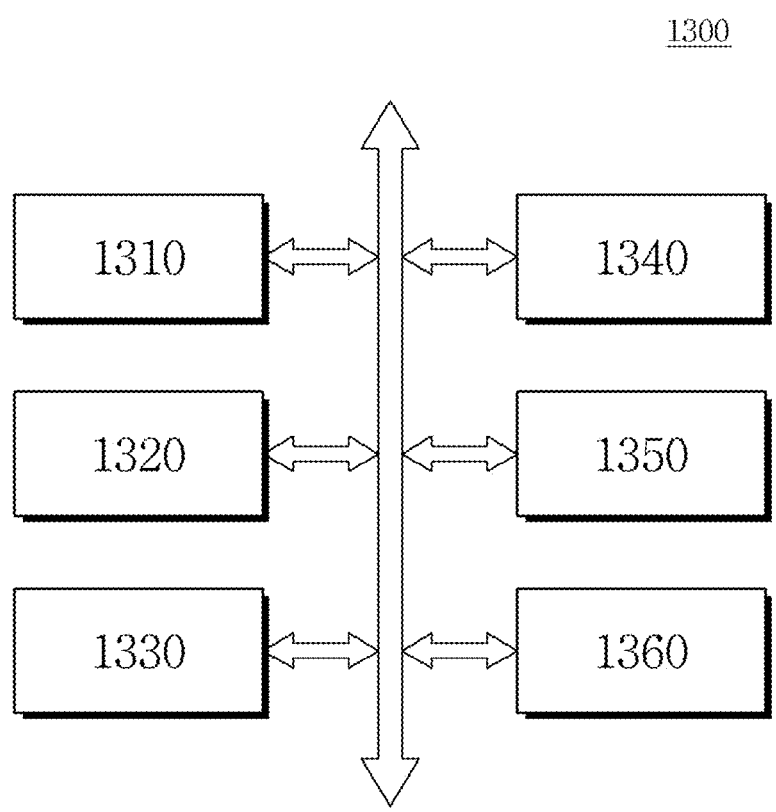
FIG. 31 is a schematic block diagram of an electronic system including a semiconductor module having a stack-type semiconductor package according to example embodiments of inventive concepts.

FIG. 31 is a schematic block diagram of an electronic system 1300 including a semiconductor module having stack-type semiconductor packages according to example embodiments of inventive concepts.

Referring to FIG. 31, the electronic system 1300 according to example embodiments of inventive concepts may include a control unit 1310, an input unit 1320, an output unit 1330, and a storage unit 1340 and further include a communication unit 1350 and/or another operation unit 1360.

The control unit 1310 may generally control the electronic system 1300 and respective units. The control unit 1310 may be interpreted as a CPU and/or an MCU and include the electronic circuit board 1200 according to example embodiments of inventive concepts. Also, the control unit 1310 may include a semiconductor module 1100 having stack-type semiconductor packages according to example embodiments of inventive concepts.

The input unit 1320 may transmit electrical command signals to the control unit 1310. The input unit 1320 may be an image recognition unit, such as a keyboard, a keypad, a mouse, a touch pad, or a scanner, or various input sensors. The input unit 1320 may include a semiconductor module 1100 having stack-type semiconductor packages according to example embodiments of inventive concepts.

The output unit 1330 may receive electric command signals from the control unit 1310 and output processing results of the electronic system 1300. The output unit 1330 may be a monitor, a printer, a beam radiator, or various mechanical apparatuses. The output unit 1330 may include a semiconductor module 1100 having stack-type semiconductor packages according to example embodiments of inventive concepts.

The storage unit 1340 may be a component configured to temporarily or permanently store electric signals already processed or to be processed by the control unit 1310. The storage unit 1340 may be physically and electrically connected or combined with the control unit 1310. The storage unit 1340 may be a semiconductor memory, a magnetic storage device such as a hard disk, an optical storage device such as a compact disc (CD), or a server having other data storage functions. Furthermore, the storage unit 1340 may include a semiconductor module 1100 having stack-type semiconductor packages according to example embodiments of inventive concepts.

The communication unit 1350 may receive electric command signals from the control unit 1310 and transmit and receive electric signals to and from another electronic system. The communication unit 1350 may be a modem, a wired transceiving device such as a LAN card, a wireless transceiving device such as a wireless broadband (WiBro) interface, or an infrared (IR) port. In addition, the communication unit 1350 may include a semiconductor module 1100 having stack-type semiconductor packages according to example embodiments of inventive concepts.

The operation unit 1360 may perform physical or mechanical operations in response to commands of the control unit 1310. For example, the operation unit 1360 may be a component configured to perform mechanical operations, such as a plotter, an indicator, or an up/down operator. The electronic system 1300 according to example embodiments of inventive concepts may be a computer, a network server, a networking printer or scanner, a wireless controller, a mobile communication terminal, an exchanger, or an electronic product capable of other programmed operations.

According to example embodiments of inventive concepts, connection pads configured to electrically connect a lower semiconductor package and an upper semiconductor package can be formed on a top surface of a lower encapsulant formed on a lower package substrate.

Each of the connection pads can be electrically connected to a lower solder ball of the lower package substrate through a via hole formed in the lower encapsulant, and be electrically connected to an upper solder ball of the upper package substrate on the lower encapsulant. Since each of the connection pads serves as an electrical path between the upper semiconductor package and a lower semiconductor package, a stack-type semiconductor package having a fine ball pitch can be embodied.

A metal layer pattern formed on the entire surface of the lower package substrate apart from the connection pads can function as a heat sink configured to dissipate heat generated by a lower semiconductor chip. Thus, a stack-type semiconductor package having excellent heat radiation characteristics can be embodied. Furthermore, since the metal layer pattern can function as an EMI shield layer, the reliability and durability of the stack-type semiconductor package can be improved.

The foregoing is illustrative of embodiments and is not to be construed as limiting thereof.

While some example embodiments have been particularly shown and described, it will be understood by one of ordinary skill in the art that variations in form and detail may be made therein without departing from the spirit and scope of the claims.

What is claimed is:

1. A stack-type semiconductor package comprising:
   a lower semiconductor package including a lower package substrate, a lower semiconductor chip on a top surface of the lower package substrate, lower solder balls on the top surface of the lower package substrate in a vicinity of the lower semiconductor chip, and an encapsulant on the top surface of the lower package substrate, the encapsulant defining via holes that expose the lower solder balls;
   an upper semiconductor package on the encapsulant, the upper semiconductor package including upper solder balls connected to a bottom surface of the upper semiconductor package;
   connection pads on the via holes and the encapsulant, the connection pads electrically connecting the lower semiconductor package to the upper semiconductor package; and
   a metal layer pattern between the lower package substrate and the upper semiconductor package, the metal layer pattern surrounding the connection pads and being isolated from the connection pads.

2. The package of claim 1, wherein a same metal layer defines the metal layer pattern and the connection pads.

3. The package of claim 1, wherein
   the connection pads are electrically connected to the lower solder balls through the via holes, and
   the connection pads are electrically connected to the upper solder balls on the encapsulant.

4. The package of claim 1, wherein each one of the connection pads conformally covers both sidewalls of a corresponding one of the via holes, exposed surfaces of a corresponding one of the lower solder balls, and the encapsulant.

5. The package of claim 1, wherein each one of the connection pads fills a corresponding one of the via holes.

6. The package of claim 1, wherein in a plan view, each of the connection pads has an area covering a corresponding one of the lower solder balls and a corresponding one of the upper solder balls.

7. The package of claim 1, further comprising:
   redistribution patterns electrically connected to the upper solder balls and the connection pads,
   wherein the redistribution patterns and the connection pads are defined from a same metal layer.

8. The package of claim 7, wherein the redistribution patterns are on top of the lower semiconductor chip.

9. The package of claim 8, wherein the upper solder balls are on the lower semiconductor chip.

10. A stack-type semiconductor package comprising:
    a lower semiconductor package including a lower package substrate, lower lands on a top surface on the lower package substrate, a lower semiconductor chip on the top surface of the lower package substrate, and an encapsulant on the top surface of the lower package substrate, the encapsulant defining via holes that expose the lower lands;

an upper semiconductor package on the encapsulant, the upper semiconductor package including upper solder balls connected to a bottom surface of the upper semiconductor package;

connection pads on the via holes and the encapsulant, the connection pads electrically connect the lower semiconductor package to the upper semiconductor package; and a metal layer pattern between the lower package substrate and the upper semiconductor package, the metal layer pattern surrounding the connection pads and being isolated from the connection pads.

11. The package of claim 10, wherein
the connection pads are electrically connected to the lower lands through the via holes, and
the connection pads are electrically connected to the upper solder balls on the encapsulant.

12. The package of claim 10, wherein a same metal layer defines the metal layer pattern and the connection pads.

13. The package of claim 10, wherein in a plan view, each of the connection pads has an area covering a corresponding an exposed surface of a corresponding one of the lower lands and a corresponding one of the upper solder balls.

14. The package of claim 10, further comprising:
redistribution patterns electrically connecting the upper solder balls, to the connection pads, wherein
a same metal layer defines the redistribution patterns and the connection pads.

15. The package of claim 14, wherein the redistribution patterns are on a top surface of the lower semiconductor chip, and the upper solder balls are on the lower semiconductor chip.

16. A stack-type semiconductor package comprising:
a lower package substrate;
lower lands on the lower package substrate, the lower lands surrounding a portion of the lower package substrate;
a lower semiconductor chip on the portion of the lower package substrate;
an encapsulant on the lower package substrate, the encapsulant surrounding the lower semiconductor chip and defining via holes that expose the lower lands;
a metal layer pattern on the encapsulant over at least part of the portion of the lower package substrate;
an upper semiconductor package on the lower package substrate, the upper semiconductor package including upper solder balls connected to a bottom surface of the upper semiconductor package; and
connection pads electrically isolated from the metal layer pattern, the metal layer pattern surrounding the connection pads, the connection pads being electrically connected through the via holes to the lower lands, respectively, and the connection pads being electrically connected to the upper solder balls, respectively.

17. The package of claim 16, further comprising:
lower solder balls in the via holes between the connection pads and the lower lands, respectively,
wherein each one of the upper solder balls is electrically connected to a corresponding one of the lower lands through a corresponding one of the connection pads and a corresponding one of the lower solder balls.

18. The package of claim 16, further comprising:
a metal redistribution pattern on the lower semiconductor chip, wherein
the upper solder balls are on the metal redistribution pattern and electrically connected to the metal redistribution pattern,
the metal redistribution pattern is surrounded by the metal layer pattern and electrically isolated from the metal layer pattern, and
the metal redistribution pattern electrically connect each one of the upper solder balls to a corresponding one of the connection pads.

19. The package of claim 16, wherein each one of the connection pads is directly connected to a corresponding one of the lower lands.

20. The package of claim 16, wherein a same metal layer on a top surface of the encapsulant defines the metal layer pattern and the connection pads.

* * * * *